(12) United States Patent
Majumdar

(10) Patent No.: US 10,985,775 B2
(45) Date of Patent: Apr. 20, 2021

(54) SYSTEM AND METHOD OF COMBINATORIAL HYPERMAP BASED DATA REPRESENTATIONS AND OPERATIONS

(71) Applicant: KYNDI, INC., Redwood City, CA (US)

(72) Inventor: Arun Majumdar, Alexandria, VA (US)

(73) Assignee: KYNDI, INC., Redwood City, CA (US)

( * ) Notice: Subject to any disclaimer, the term of this patent is extended or adjusted under 35 U.S.C. 154(b) by 8 days.

(21) Appl. No.: 14/965,708

(22) Filed: Dec. 10, 2015

(65) Prior Publication Data

US 2016/0173124 A1 Jun. 16, 2016

Related U.S. Application Data

(60) Provisional application No. 62/090,190, filed on Dec. 10, 2014.

(51) Int. Cl.
*H03M 7/30* (2006.01)
*G06F 16/2452* (2019.01)
(Continued)

(52) U.S. Cl.
CPC .......... *H03M 7/30* (2013.01); *G06F 16/2452* (2019.01); *G06F 16/28* (2019.01); *H03M 7/04* (2013.01);
(Continued)

(58) Field of Classification Search
CPC .............................. H03M 17/04; H03M 17/30
See application file for complete search history.

(56) References Cited

U.S. PATENT DOCUMENTS 8,046,206 B1 * 10/2011 Hood, III ............ G06F 17/5045
703/13
9,158,847 B1 * 10/2015 Majumdar ........ G06F 17/30312
(Continued)

FOREIGN PATENT DOCUMENTS

CN 103701469 A 4/2014
CN 103902374 A 7/2014
(Continued)

OTHER PUBLICATIONS

International Search Report and Written Opinion dated Mar. 7, 2016 in PCT/US15/65043 (with Search History).
(Continued)

*Primary Examiner* — Chuong D Ngo
(74) *Attorney, Agent, or Firm* — Oblon, McClelland, Maier & Neustadt, L.L.P.

(57) ABSTRACT

A method and apparatus is provided for implementing combinatorial hypermaps (CHYMAPS) and/or generalized combinatorial maps (G-Maps) based data representations and operations, comprising: mapping term-algebras to tree-based numbers using a fast algorithm and representing a graph of the mapping structure as a CHYMAPS using reversible numeric encoding and decoding; generating a representation of CHYMAPS in a form optimized for sub-map (sub-graph) to map (graph) isomorphism and partial matching with a general matching process; performing operations on the CHYMAPS as operations on respective numerical representations; performing compression and decompression using a three bit self-delimiting binary code; and storing and retrieving codes.

29 Claims, 18 Drawing Sheets

(51) Int. Cl.
*H03M 7/04* (2006.01)
*H03M 7/14* (2006.01)
*H03M 7/46* (2006.01)
*G06F 16/28* (2019.01)

(52) U.S. Cl.
CPC .......... *H03M 7/14* (2013.01); *H03M 7/3097* (2013.01); *H03M 7/46* (2013.01)

(56) References Cited

U.S. PATENT DOCUMENTS

| | | | |
|---|---|---|---|
| 9,630,110 B2* | 4/2017 | Kruglick | A63F 13/65 |
| 2005/0009417 A1* | 1/2005 | Meding | G06F 17/5022 439/894 |
| 2007/0239694 A1 | 10/2007 | Singh et al. | |
| 2011/0055545 A1 | 3/2011 | Sovio et al. | |
| 2011/0173189 A1 | 7/2011 | Singh et al. | |
| 2016/0125094 A1* | 5/2016 | Li | G06F 21/552 707/741 |

FOREIGN PATENT DOCUMENTS

| | | |
|---|---|---|
| JP | 2003-533752 A | 11/2003 |
| WO | 2006/029962 A1 | 3/2006 |

OTHER PUBLICATIONS

Paul Tarau, ""Everything is Everything" Revisited: Shapeshifting Data Types with Isomorphisms and Hylomorphisms" Complex Systems, vol. 18, 2010, pp. 475-493.

Shahin Kamali, "Alternative Approaches for Analysis of Bin Packing and List Update Problems" University of Waterloo, Retrieved from the Internet [https://uwspace.uwaterloo.ca/handle/10012/8843], 2014, pp. 102-113 (with cover pages and Abstract).

Notification of the First Office Action (PCT Application in the National Phase) dated Apr. 29, 2020 in corresponding Chinese Patent Application No. 201580073762.7 (with English translation)(10 pages).

Japanese Office Action dated Oct. 25, 2019 in Japanese Application No. 2017-550087 with English Translation, 5 pages.

Examination report dated Jul. 27. 2020 from corresponding Indian Patent Application No. 201747023110 (with English translation)(6 pages).

Kraemer et al., "CGoGN: n-dimensional Meshes with Combinatorial Maps," Jan. 1, 2014 (cited in the Indian Examination report listed in AW)(20 pages).

Paul Tarau, "Tree-based Arithmetic and Compressed Representations of Giant Numbers," Jan. 1, 2013 (cited in the Indian Examination report listed in AW)(6 pages).

Communication pursuant to Article 94(3) EPS dated Jan. 13, 2021 in corresponding European Patent Application No. 15 868 007.4 (9 pages).

Solnon et al., "On the complexity of submap isomorphism and maximum common submap problems", Pattern Recognition, Elsevier, GB, vol. 48, No. 2, Jun. 12, 2014 (Jun. 12, 2014), pp. 302-316, XP029018778, ISSN: 0031-3203, DOI: 10.1016/J.PATCOG.2014.05.019 (15 pages).

Liang et al., "Fast Flow Analysis with Gödel Hashes", 2014 IEEE 14TH International Working Conference on Source Code Analysis and Manipulation, IEEE, Sep. 28, 2014 (Sep. 28, 2014), pp. 225-234, XP032699318, DOI: 10.1109/SCAM.2014.40 (10 pages).

Yun Chi et al., "Canonical forms for labelled trees and their applications in frequent subtree mining", Knowledge and Information Systems ; An International Journal, Springer-Verlag, LO, vol. 8, No. 2, Aug. 1, 2005 (Aug. 1, 2005), pp. 203-234, XP019356261, ISSN: 0219-3116 (32 pages).

\* cited by examiner

FIG. 4A

230 inv2code=method to generate an integer code from a unique fixed point free involution
410

> involution_code=generates involution on [0..2n-1] as set of n pairs and stores value K and Ks for reversible process.
> 412

> bij_encode=Given 1*3*5*(2n-1) fixpoint-free involutions, encode these using bijective base-k encodings corresponding to a bijective positional notation
> 414
>
>> bij_encode_step=increment the bijective base by 2
>> 416
>>
>>> put_bdigit=adds a binary base B digit D to a natural number N
>>> 418

FIG. 4B

230(reverse)

code2inv=method to generate a unique fixed point free involution from an integer code
420

> involution_code=generates involution on [0..2n-1] as set of n pairs and stores value K and Ks for reversible process.
> 422

> bij_decode=inverts the steps used in the encoding
> 424
>
>> bij_decode_step=colects digits one by one and increments the bijective base 2
>> 426
>>
>>> get_bdigit=extracts a bijective base B digit D from a positive natural number N and returns a remainder NewN, which can be zero.
>>> 428

FIG. 12 f(X,g(X),a,10)    a1(7, [a0(0, 0), a1(8, [a0(0, 0)]), a0(1, 2), a0(2, 21)])

Strings can be seen as numbers in bijective base-k where k is the size of the alphabet. Hence we write a bijection between a word, a list of its alphabet as ascii codes, and a number N.

hello = [104, 101, 108, 108, 111] = 7073803

| TERM | SKELETON | CONTENT |
|---|---|---|
| f(a, g(b, X), h(X, 10)) | (()(()())(()())) + | [f, a, g, b, X, h, X,10] |

Encode the skeleton into a number N
Then, encode the content symbol lists into M,
then we merge the skeleton and content encodings, N and M together via pairing ( ()   (()())   (()())  )

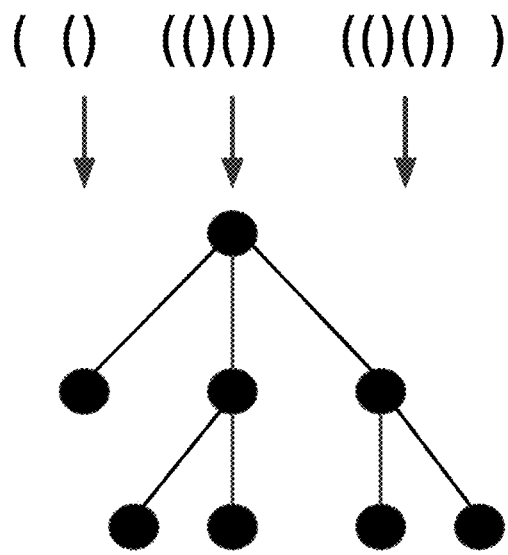

Dart Labeling Algorithm

Input: map M, and start dart d.
Output: symbol sequence description S of map M.

Definitions: queue Q stores temporary vertices to be visited.
L denotes the Label of current vertex.
hx and tx denote the head vertex and the tail vertex of dart x, respectively.
gv denotes the degree of vertex v.
fv denotes the first dart of which root-vertex is v.
sx denotes the symbol of dart x.

Initialize queue Q and sequence S to be empty, L = 1
Set u = td and
Set fu = d.
Push u into Q, and mark u as visited
while Q is not empty do
    Delete the first vertex, v, from Q.
        for k = 0 to gv -1, with x = Pkfv, do
            if the edge of x is not marked yet do
                Mark x (and the edge) as symbol L, so sx = L.
                L = L + 1;
            else do
                Calculate sx according to the marked edge.
            end if
            if vertex hx is not visited do
                Set u = hx
                Set fu = cx.
                Push vertex u into Q and mark vertex u as visited.
            end if
        S = S + sx;
        end for
    S = S + Next.
end while

Term-Algebra Term to Term-Tree Algorithm

Input:     the model map M of a Term-Algebra Term
Output:    the symbol tree TT(M).

Definitions:  |s| denotes the number of symbols in symbol sequence s.
si denotes the ith symbol in s.
mv denotes the symbol associated with node v.
Cv denotes the set of children of node v.

For map M construct the submap sequence set and convert to natural number D(M).
Initialize TT(M) having only the root with symbol '1'.
for all sequence s from 2 to D(M) do
    Let v be the root of T(M).
    for i = 2 to |s| do found = false;
        for all u from 2 to Cv do
            if mu = si
                dov = u,
                found = true;
            end if
        end for
        if not found
            Add a node u with symbol si into TT(M) as a child of v,
                set v = u.
        end if
    end for
end for

Term-Graph Precompiler Algorithm

Input:      the model map M.
Output:    the term graph tG(M).

Definitions:  Tv denotes the subtree rooting with node v and
              containing all descendants of v.
              Cv denotes the set of children of node v.
              Q is a queue initialized to be empty.

Construct the term tree, TT(M).
Initialize TG(M) as a copy of TT(M), and then change each edge as
      directed from the parent to the child.
Push the root of TG(M) into Q.
while Q is not empty do
      Delete the first node, v, from Q.
      for all u in TG(M) other than v do
            if Tu is equivalent to Tv do
                  Remove Tu from TG(M), and then add edge
            (pu, v)into TG(M).
            end if
      end for
      for all u from 2 to Cv do
            Push u into Q.
      end for
end while

Term-Graph Unification Algorithm

Input:   model map M and pattern map G.
Output:  whether G is sub-isomorphic with M.

Definitions:
    TG(M) is the term-graph of M built by compilation of terms to TT and then TG.
    numerate is the algorithm for symbol sequence to CHYMAP number.
    |s| denotes the number of CHYMAP numbers s, and si denotes the $i^{th}$ element in s.
    mv denotes the CHYMAP number associated with node v.
    ADJ(v) denotes the set of the adjacent nodes of v.

Pseudo code

```
select a dart x in G,
let s = numerate(G, x)
let v be the root of TG(M)
for i = 2 to |s| do
        found = false;
        for u=2 to ADJ(v) do
                if mu = si do
                        found = true,
                        v = u;
                        break;
                end if
        end for u
        if not found do
                return false;
        end if
end for i
return true;
```

SYSTEM AND METHOD OF COMBINATORIAL HYPERMAP BASED DATA REPRESENTATIONS AND OPERATIONS

CROSS-REFERENCE TO RELATED APPLICATIONS

This application is based upon and claims the benefit of priority to provisional U.S. Application No. 62/090,190, filed Dec. 10, 2014, the entire contents of which are incorporated herein by reference.

FIELD

Embodiments disclosed herein relate generally to a method and apparatus for encoding combinatorial hyper maps (CHYMAPS) using a unique reversible code and a tree based numbering system that embeds term algebras into the CHYMAPS; and, more particularly, the apparatus and method provide complex data structure representation, pattern recognition, fast unification of sub-graphs, and arithmetic operations on the numberings that are reversible and lossless (i.e., bijective) to operations on the term-algebras.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Search engines, relational database systems, graph representation and most structural data representation and computation systems, have the property that data are stored as integers. Encoding, operating with and, decoding of these integers consumes considerable CPU time. Therefore, substantial effort has been made to reduce costs associated with computation by operating on reduced size or compression and decompression schemes for data.

SUMMARY

A method and apparatus are provided for implementing representing data as combinatorial hypermaps (CHYMAPS), generalized combinatorial maps (G-Maps), and/or term-algebra terms and encoding same as a natural number or a tree-based number. The method and apparatus further includes performing a unification process over isomorphic submaps of the data representations. The method also includes operations, comprising: mapping term-algebras to tree-based numbers using a fast algorithm and representing a graph of the mapping structure as a CHYMAPS using reversible numeric encoding and decoding; generating a representation of CHYMAPS in a form optimized for submap (sub-graph) to map (graph) isomorphism and partial matching with a general matching process; performing operations on the CHYMAPS as operations on respective numerical representations; performing compression and decompression using a three bit self-delimiting binary code; and storing and retrieving codes.

BRIEF DESCRIPTION OF THE DRAWINGS

A more complete understanding of this disclosure is provided by reference to the following detailed description when considered in connection with the accompanying drawings, wherein:

FIG. 4A shows a flow diagram of a method of bijective encoding a fixedpoint free involution as a natural number, according to one implementation;

FIG. 4B shows a flow diagram of a method of bijective decoding a natural number to a fixedpoint free involution, according to one implementation;

FIG. 12 shows an example of bijectively encoding a term-algebra term as a natural number, according to one implementation;

FIG. 13 shows a flow diagram of a method to label darts of a combinatorial hypermap using a symbol sequence, according to one implementation;

FIG. 14 shows a flow diagram of a method to encode a term-algebra term and a term tree, according to one implementation;

FIG. 15 shows a flow diagram of a method to generate term-graphs from a term-algebra term, according to one implementation;

FIG. 16 shows a flow diagram of a method of performing term graph unification, according to one implementation.

DETAILED DESCRIPTION

Figure 1:
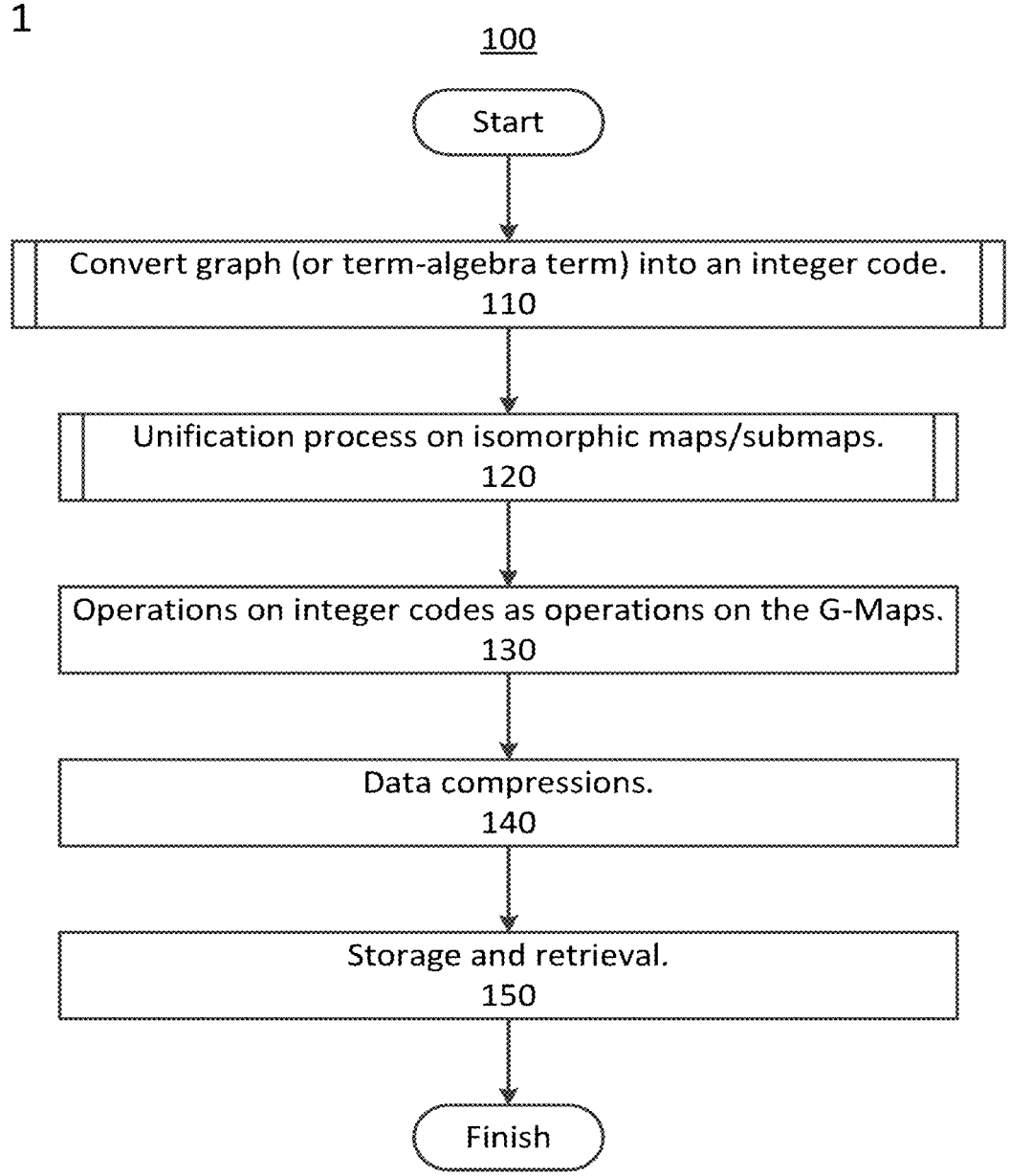
FIG. 1 shows a flow diagram of a method of encoding a graph or a term-algebra term as a Gödel number that can be a natural number or a tree-based number and perform a unification on isomorphic submaps of the graph or term-algebra term, according to one implementation.

Graphs can provide a powerful representation of knowledge and relationships in many fields of endeavor. Graph databases store graph structures instead of tables of data. Typically, graph databases are applicable in domains that require storage and retrieval of complex topological information, like neural networks, semantic networks, social networks, related networks of stories, scenarios, routes, paths, roads, or geographic information systems (GIS). One of the main issues in graph databases is retrieval of member graphs based on structure matching. Structure matching of graphs is a known NP-complete problem. In large graph databases structure matching becomes very difficult because structure matching has to be performed against a vast number of graphs in the database. Retrieval from dynamical topological graph databases is even more difficult than retrieval from pre-indexed property-based graph databases because there is no decomposition space and the spaces are always dynamically changing.

The methods and apparatus described herein provide functions of matching graph structure for high-speed logic based reasoning. Using a knowledge representation model, information is represented as graphs. These graphs can be transformed into generalized combinatorial maps (G-Maps). Using the representation of a generalized combinatorial mapping (G-Map) for the graph structures, the algorithm uses the property of lattice paths as locales, inherent within G-Maps, to determine if sub-graphs of the graph structures are isomorphic based on the locales. Given that the locales can be represented by a real number that approximates an area swept by an angle from the centroid of the hypersphere, derived from its quantized subdivision of a permutohedral complex, the candidate subgraphs for isomorphism testing can be achieved low polynomial or at best log(N) time. Using CHYMAP-NUMBER indexes for each locale, the algorithm can quickly discern locales that are isomorphic in the given graph structures.

Combinatorial maps (hypermaps) can be topological representations of graphs (hypergraphs), and are defined by a pairs of permutations acting on a finite set of darts, wherein darts represent couples made of a vertex and an incident edge, and a permutation gives an order to the edges (vertices) incident to a given vertex (edge). A hypergraph is a graph in which generalized edges (called hyperedges) may connect more than two nodes. Herein, the methods described herein in terms of G-Maps are general and also apply to combinatorial hypermaps. Similarly, unless explicitly stated otherwise, the methods described herein in terms of combinatorial hypermaps are general and also apply to G-Maps.

The G-maps can be represented lists of numbers (e.g., darts, permutations, and involutions) that are used to uniquely define the respective G-maps. Additionally, these lists of numbers can be represented by a single number using Gödel numbering (e.g., using cantor numbering to map pairs of numbers as a single number, which can be performed repeatedly to map a list of numbers to a single number), where the transformation between a list of numbers and its Gödel number is performed using a bijective (i.e., reversible transformation). However, the Gödel numbers corresponding to long lists of numbers can be very large, creating challenges for storing and representing these numbers using conventional computer hardware. This challenge is overcome using a tree-based integer representation that is well adapted to compactly representing very large numbers. Standard mathematical operations can be performed with the graphs and/or sub-graphs represented using a tree-based integer representation of the Gödel number of the graphs and/or sub-graphs. Thus, computationally intensive functions such as comparing two sub-graphs, which would otherwise require extensive computations to traverse and compare nodes can be performed in a few clock cycles using fundamental arithmetic operations on the corresponding Gödel numbers.

Accordingly, the methods described herein use vectorized encoding based on tree-based numberings representing complex structure data that achieve orders of magnitude faster performance than the previously fastest schemes capable of handling the large numbers used to represent complex data objects corresponding to knowledge representations (e.g., graphs). In fact, in most cases the methods described herein achieve an exponential speed up relative to the previous state of the art methods. Additionally, the methods achieve significant reductions in the computer storage needed to store the representations of the Gödel numbers corresponding to graphs. Therefore, the methods described herein can significantly improve processor performance by reducing the main-memory bandwidth requirements, by carrying out most computations in the encoded form while also enabling further compression/decompression to be utilized in the optimization of resource consumption of memory.

The methods described herein have application for example in the fields of chemical informatics, and particularly, in the fields of quantitative structure activity relationship (QSAR) modeling, there are many topological indices that can be computed on the graph of the chemical under study. Examples include the Hosoya Index, or the Wiener Index. These indices are essentially functions on the connectivity matrix of the graph underlying the chemical structure and also the properties of the atoms of the graphs (such as the electronegativity value of the atom).

As discussed above, graph sub-graph isomorphism is an NP hard problem in the general case. Using the new encoding of the methods described herein, the method encodes locales of a graph and successively iterates the graph through successive encodings by collapsing adjacent neighborhoods of subgraphs of a graph into bijective integer representations in order to handle progressively larger and more complex graphs on standard computing hardware. The process is linear in performance with a best case computational performance of order log(N) for direct index lookup, wherein N corresponds to the size of the graph with respect to the number of nodes and edges. The worst case performance is the same as the theoretical limit for the graph problem space (i.e., in the worst case the problem becomes NP hard). The methods described herein use a simplification step and an approximation step to generate . . . based on a standard unification match but that returns candidates at high speed.

The methods described herein include a succession of encodings that represent G-maps, term-algebras, and complex computational structures as integer codes and then perform computations on the integers codes directly in order to perform quickly computations that would require significantly more time if performed directly on the objects represented by the integer codes. Various integer codes are used in the representations of the G-Maps, the term-algebra, and for representing complex data structures and corresponding operations on the integer codes according to the methods described herein.

The integer codes provide a system and method for computations on complex data structures for pattern recognition. For example, the encoding works on words or a term-algebra over any alphabet with arbitrary weights assigned to any letter. The integer codes can be used as a hash to index the partial maps as well as to recover the structure of the partial maps. Further, each set of integer codes can be used to reconstruct an originating graph in a lossless way. Thus, computations on the integer codes represent computations on the G-Maps.

Contributions of the methods described herein include, but are not limited to, 1) implementing G-Maps in logic programming; 2) producing a Gödel algebra for the dart of the G-Maps such that open and closed (orbits) are defined; 3) using the G-Maps to represent any arbitrary network or graph, such that the smallest structural unit of the graph defined by an algebra on the darts (e.g., given that darts describe a node in terms of their neighboring darts by way of involutions, such that cycles determine closed structures, it is possible to reconstruct the graph from the G-Map representation by tracing back the involutions of the darts regardless of the graph size, type, and form as partial submaps); 4) reconstructing any target graph from the above-described unit/partial submaps as a function on the involutions of the darts in which the graph is an analog of the combinatorial map; and 5) generating a query from an input graph by transforming the input into its analog G-Map such that a unification mechanism acts directly as the mapping function builds the input.

Thus, the methods described herein provide a knowledge representation model that models conceptual graphs as a set of submaps (i.e., G-Maps) that essentially is a set of involutions or functions over the darts of the G-Maps and the number of minimum structures defined by involutions such as orbits (e.g., triangles) around a node that is represented by the darts. This knowledge representation model is enabled by the fact that once a node is described in terms of its darts and orbits, it is possible to reconstruct a simplex by tracing back the connectivity of the submap regardless of the interaction map size, type and form. As discussed herein, this representation of the submap/map also greatly facilitates the exploration of the submap/map in a functional piecewise manner to find isomorphic patterns by application of structural constraints. The smallest structural unit of the graph can be defined by the algebra on the darts and can be designated by a term m. As described herein, this m based representation of the darts in terms of orbits and involutions enables indexing each m separately, while simultaneously enabling access to all the structural information of each m such that the m's can be used like pieces in a giant jigsaw puzzle. Therefore, a conceptual graph can be viewed as a bipartite set of node descriptions, and the relationship among node descriptions can be localized and decoupled from the entire graph. Thus, each node is defined as a sub-structure of the larger graph, similar to a piece of a huge complex jigsaw puzzle.

Referring now to the drawings, wherein like reference numerals designate identical or corresponding parts throughout the several views, FIG. 1 shows a flow chart of a method 100 of encoding graphs or term algebras and comparing submaps as term trees to perform unification.

In process 110 of method 100, the graph or term algebra is encoded as a Gödel number by representing the graph or term algebra using fixed point free involutions and then encoding the fixed point free involutions as a natural number that is a Gödel number. Additionally, the natural number that is a Gödel number can be further encoded as a tree-based number using a three bit self-delimiting binary code. Depending on the size of the natural number, representing the Gödel number as a tree-based number can improve the memory storage size of the Gödel number while still providing for mathematical operations to be performed directly on the tree-based number representation of the Gödel number without having to transform back into a natural number to perform mathematical operations. All of the transformations from the graph or term algebra to the Gödel number are bijective, which means they are lossless and reversible.

Further, by use of this encoding methods together with using fixed point free involutions, in contrast to conventional involutions, results in numerous advantages. Method 100 provides compact bijective encoding with no information lost. The resulting integers are represented more space-efficiently as bitstrings in the computer's memory, rather than conventional data structures. Further, the above described representations require less memory because they can be stored faster and can improve caching behavior of a contiguous bitstring segment, thus yielding improved performance relative to pointer-based data structures scattered in non-contiguous memory areas.

In process 120 of method 100, the encodings of the graph/term algebra are used to perform rapid comparisons between submaps of the graph/term algebra represented as term trees in order to perform a unification process.

In step 130 of method 100, various mathematical operations can be performed directly on the integer codes. The mathematical operations performed in the natural numbers or tree-based number representing the Gödel numbers are equivalent to mathematical operations directly on the graph/term algebra.

In step 140 of method 100, the integer codes are compressed by representing the integer codes using tree-based numbers. In certain implementations, the tree-based numbers can be represented in computer memory using a three bit self-delimiting binary code. Optionally, the representing of the integer codes using tree-based numbers can be performed after process 110 and before process 120. Alternatively, the representing of the Gödel numbers using tree-based numbers can be performed after process 120 and before step 130.

In step 150 of method 100, various results of process 110, process 120, step 130, and step 140 can be stored and later retrieved for further processing and comparisons.

Method 100 advantageously provides a fast method to map term-algebras to tree-based numbers and representing the graph of these structures as a G-Maps using a unique reversible numeric encoding and decoding method. Further, Method 100 advantageously provides a representation of the G-Maps in a form optimized for sub-map (sub-graph) to map (graph) isomorphism and partial matching. Additionally, method 100 advantageously provides a process for general matching, also known as unification.

Details of the process and steps of method 100 are described below.

Figure 2:
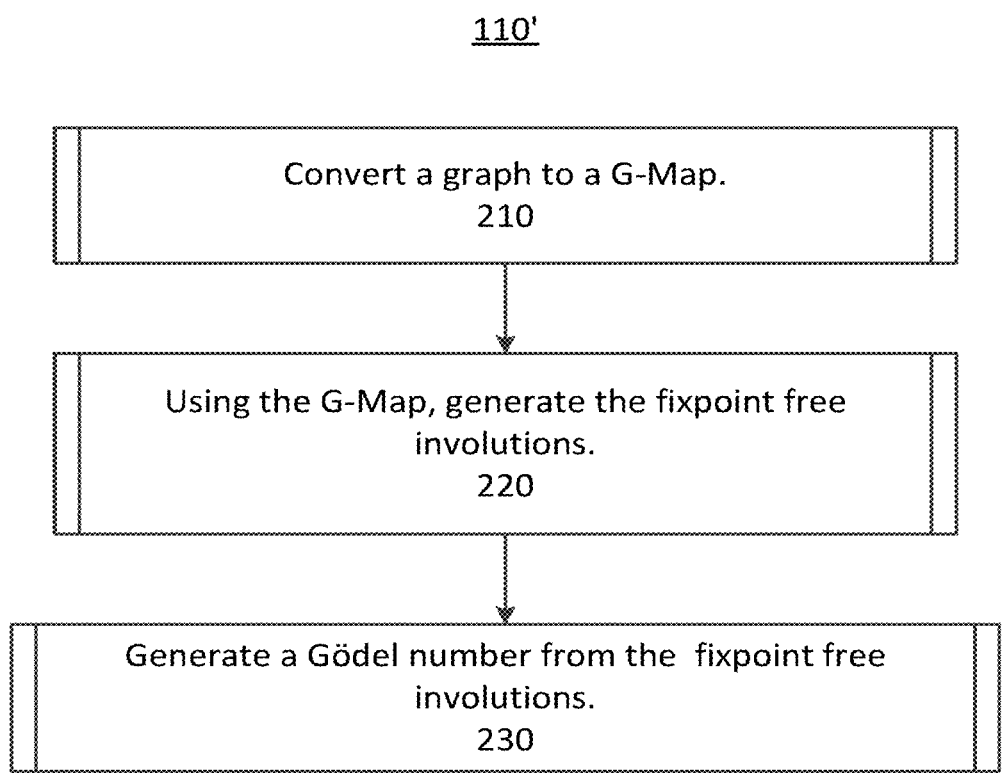
FIG. 2 shows a flow diagram of a process of encoding a graph or a term-algebra term as a Gödel number that can be a natural number or a tree-based number, according to one implementation.

Two implementations of process 110 are discussed herein. FIG. 2 shows a flow diagram of process 110', which is the first implementation of process 110. Process 110' reversibly transforms a graph into a Gödel number. In mathematical logic, a Gödel numbering is a function that assigns to each symbol and well-formed formula of some formal language a unique natural number, called its Gödel number. As used herein, the Gödel number for a graph is a single number that represents all of the darts, involutions, permutations, etc. that represent the G-Map of a graph.

The first process in process 110 (i.e., process 210) starts with a graph and generates G-Map representation of a graph. For example, FIG. 3D shows a graph, and FIG. 3E shows the G-Map corresponding to the graph shown in FIG. 3D. The graph can be obtained from any graph data, including, a geographical map, a social network, a molecule, or the like. A G-Map is represented in terms of the decomposition of the graph into its darts and their associated relative hierarchical submaps. The lowest level maps are made up of a0 involutions, which correspond to node-adjacency. Next are a1 involutions, this next highest level corresponds to edge-adjacency, and the next level up corresponds to face adjacency, then volume adjacency, and so forth as summarized in Table 1. Details regarding the relations between graphs and G-Maps are provided below.

TABLE 1

Representation Combinatorial Hypermaps

| Graph | G-Map | Computation |
| --- | --- | --- |
| Empty Set | Dart | |
| Vertex | Involution on darts | Oriented i(0) involution |
| Edge | Involution on darts | Oriented i(1) involution |
| Edge adjacent Face (e.g. triangle) | Orbit on darts | Oriented i(2) involution |
| Face adjacent Volume | Orbit on darts | Oriented i(3) involution |
| Volume adjacent Hypervolume | Orbit on darts | Oriented i(4) involution |
| K-Simplex | Orbit on darts | Oriented (K-1) involution |

For example, a graph can represent a topology, such as a map of roads connecting various cities. The roads connecting cities can be represented by an edge, which is defined as two darts (also referred to as half-edges), wherein each dart originates from a respective node (vertex) corresponding to a city. The dart can include pointers to a character string containing the name of the city, for example. Another graph, corresponding to chemical bonds between atoms in a molecule for example, could have the same topology as the map of roads connecting cities. However, in the molecule example the darts would include pointers to an object corresponding to the type of the atom, rather than the name of city. Thus, the graph and the G-Map represent topologies, but can also be used represent all manner of objects. In fact the object pointed to by a dart could be another G-Map. In addition to the pointer to an object, the darts can include a unique label to differentiate between darts pointing to apparently indistinguishable object (e.g., two darts pointing to identical but separate carbon atoms in an organic molecule).

In process 220 of process 110, the G-Map is used to generate the fixed point free involution representation of the G-Map. As discussed below, any G-Map lists of integers representing the darts, permutations, and involutions of the G-Map. For example, a two-dimensional combinatorial map (or 2-map) is a triplet M=(D, σ, α), wherein D is a finite set of darts, σ(φ) is a permutation on D, and α is an involution on D with no fixed point. For example, the darts for the G-Map shown in FIG. 3E are given by the set {1, −1, 2, −2, 3, −3, 4, −4, 5, −5, 6, −6}, the permutations can be given by (1, −1)(2, −2)(3, −3)(4, −4)(5, −5)(6, −6)(7, −7) and the involutions can be given by (1, 2)(3, 4, −1)(5, −4)(7, −2)(6, −3, −7)(−5, −6).

In process 230 of process 110, number composition is used to represent pairs of numbers using a single number. For example, a Cantor pairing function can be used to exemplify how pairs of numbers can be reversibly represented using a single number. Repeatedly performing number composition on pairs from the lists of numbers representing the G-Map, the G-Map representation can be consolidated into a single natural number. This single number representation of the G-Map is the Gödel number for the G-Map. The repeated composition of number pairs to a single number on a long list of number can result in the natural number representation of the Gödel number being very large—so large that it is too large to be stored using conventional number representations in computers. When this occurs, the Gödel number can be represented using a tree-based number rather than a natural number.

Next, a nomenclature for generalized combinatorial map is described. A combinatorial map is a combinatorial object modelling topological structures with subdivided objects. Combinatorial maps can be used to represent higher-dimensional orientable subdivided objects. Combinatorial maps are used as efficient data structures in image representation and processing, in geometrical modeling. This model is related to simplicial complexes and to combinatorial topology. Additionally, combinatorial maps can be generalized maps that represent non-orientable objects like the Möbius strip and the Klein bottle. A combinatorial map is a boundary representation model; it represents object by its boundaries.

Several applications require a data structure to represent the subdivision of an object. For example, a 2D object can be decomposed into vertices (0-cells), edges (1-cells), and faces (2-cells). More generally, an n-dimensional object is composed with cells of dimension 0 to n. Moreover, neighboring relations between these cells can also be represented by describing all the cells of a subdivision, plus all the incidence and adjacency relations between these cells. When all the represented cells are simplexes, a simplicial complex can be used. However, to represent any type of cells, a cellular topological model, such as combinatorial maps or generalized maps, is used.

Figure 3A:
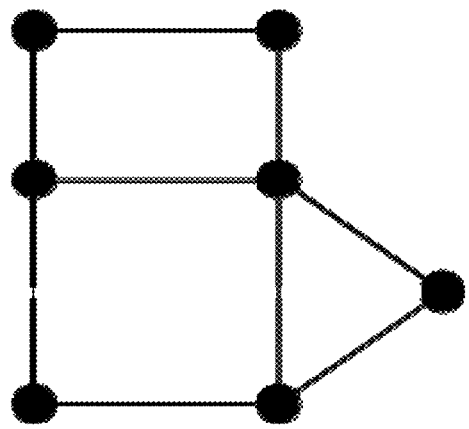
FIG. 3A shows a graph, according to one implementation.
Figure 3B:
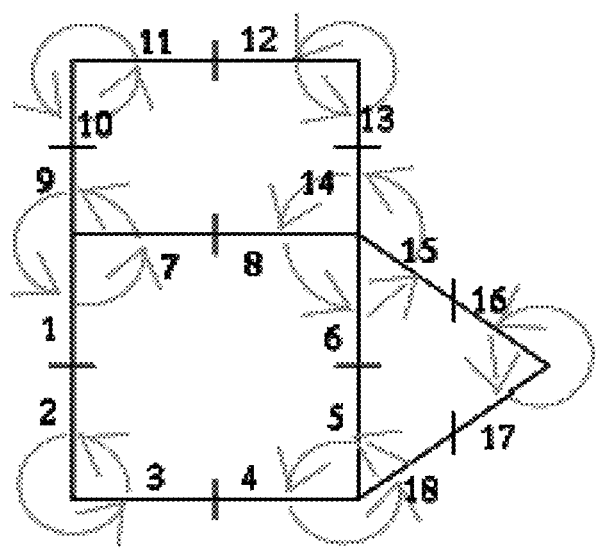
FIG. 3B shows a combinatorial map of the graph, according to one implementation.
Figure 3C:
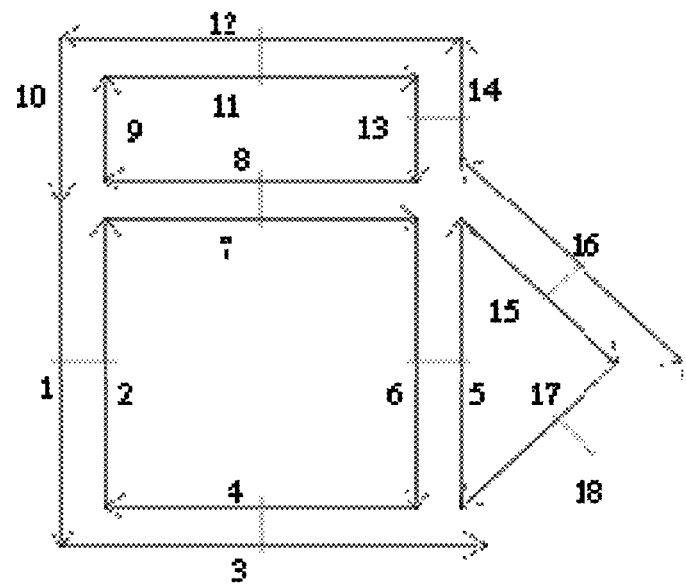
FIG. 3C shows a combinatorial map of the graph, according to another implementation.
Figure 3D:
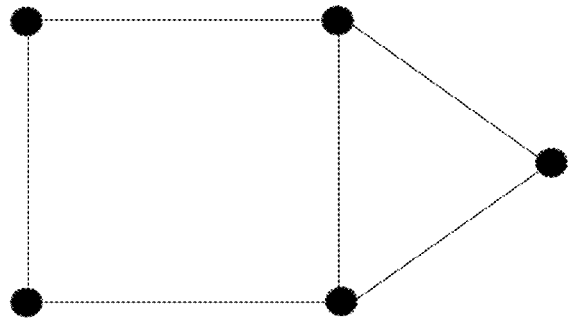
FIG. 3D shows another graph, according to one implementation.
Figure 3E:
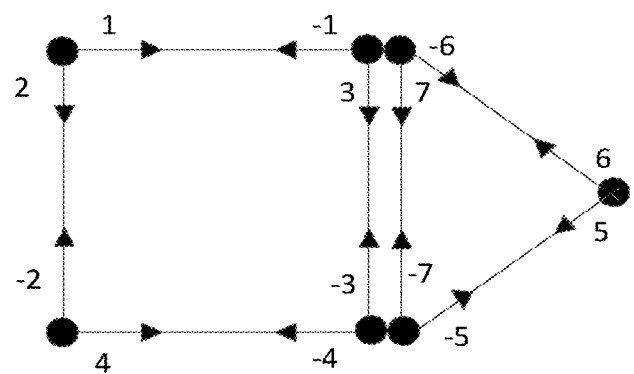
FIG. 3E shows a combinatorial map of the another graph, according to one implementation.

FIG. 3A shows an example of a plane graph. FIGS. 3B and 3C show examples of combinatorial representations of the graph of FIG. 3A using a vertex notation and a face notation respectively. A two-dimensional combinatorial map (or 2-map) is a triplet M=(D, σ, α), wherein D is a finite set of darts, σ(φ) is a permutation on D, and α is an involution on D with no fixed point.

A 2-map corresponds to a planar graph where each edge is subdivided into two darts sometimes also called half-edges). The permutation σ gives, for each dart, the next dart by turning around the vertex in the positive orientation; the other permutation α gives, for each dart, the other dart of the same edge. The involution α allows retrieval edges (alpha for arête in French), and σ allows retrieval vertices (sigma for sommet in French). An operation φ=σ o α can be defined to provide, for each dart, the next dart of the same face (phi for face also in French). Accordingly, there are two methods of representing a combinatorial map depending if the permutation is σ or φ, as shown in FIGS. 3B, and 3C. These two representations are dual to each other: vertices and faces are exchanged.

Generally, an n-dimensional combinatorial map (or n-map) is a (n+1)-tuple M=(D, $\beta_1$, ..., $\beta_n$), wherein D is a finite set of darts, $\beta 1$ is a permutation on D, ●$\beta_2$, ..., $\beta_n$ are involutions on D, ●$\beta_i$ o $\beta_j$ is an involution if i+2≤j (i, j∈{1, ..., n}). An n-dimensional combinatorial map represents the subdivision of a closed orientable n-dimensional space. A dart is an abstract element which is only required to define one-to-one mappings. The last line of this definition fixes constraints which guarantee the topological validity of the represented object: a combinatorial map represents a quasi-manifold subdivision. The initial definition of 2-dimensional combinatorial maps can be retrieved by fixing n=2 and renaming σ by $\beta_1$ and α by $\beta_2$.

Beginning from graph data, such as a molecular structure, a geographical information system (GIS) map of cities, or a social network, a G-Map can be constructed, wherein each node is labeled using a unique integer. The G-Map has an explicit encoding of the orientation of edges around a given vertex, and the edges may be composed of two half-edges, called darts, each dart having its origin at the vertex to which it is attached. The fact that two half-edges, as defined by their darts, determine the same edge is recorded in a permutation function called an involution. As a result, the successor of the first dart in the edge is the second dart, and the successor of the second dart is the first. Oriented edges have four darts: two to specify the edge, and two to specify the relative orientation or direction of the edge. The orientation for a fully oriented network can be accomplished using simply a convention about the direction of the signs of the integers representing the darts. Even when the darts are not co-incident at their half-edges, (i.e., not forming the edge of a graph), but may be originating from a node, then they are called 1-adjacent at the node, and are defined around the node, which is a cyclic permutation that defines the arrangement of darts around a node. The permutation operation is commonly called an α1-involution, and the arrangement of darts defined by the permutation is called a locale. When two darts are at two different places with respect to each other, and their half-edges, which are 0-dimensional objects, are adjacent, the two zero-dimensional incidences produce a 1-dimensional line. This involution is commonly called α0-involution. The simplest involution is multiplication by negative one (−1) so that application twice results in the original number. Each orbit of a successive sequence of darts is associated to one node and encodes the sequence of darts encountered when turning counterclockwise around this node. Face adjacency and volume or hyper-volume adjacency permutations are commonly defined and understood for generalized combinatorial maps for those skilled in the art.

Additional details and implementations of methods for manipulating G-Maps are provided in Liu, Y. P., *Enumerative Theory of Maps*. Kluwer, Boston (1999), herein incorporated by reference in its entirety, and provided in Kropatsch, W. G., December 1995. Building Irregular Pyramids by Dual Graph Contraction. IEE-Prot. Vision, Image and Signal Processing Vol. 142 (No. 6), pp. 366-374, herein incorporated by reference in its entirety.

Building on the above definitions, process 220 is realized by representing using fixed point free involutions. This is realized when a G-Map M can be represented by the triplet (D, S, Q) and an edge set E, such that M=(D, S, Q, E), wherein D corresponds to the set of darts (or half-edges) obtained by decomposing each edge into two darts, S is a permutation from Darts to Darts, whose cycles correspond to the sequence of darts encountered when turning counterclockwise around each node. The mapping from the darts to edges is a fixed point free involution whose cycles correspond to the two darts associated to a same edge. The use of is fixed point-free which means that all the pairs connect distinct ends The encoding of a topology by such a map is performed by representing each branch by two darts defining one edge (a cycle of the involution). The orientation of branches, around branching points, is explicitly encoded by the cycles of the permutation. Note that permutation S explicitly encodes the orientation of edges around each node. Furthermore, Q is a fixed point free involution whose cycles correspond to the two darts associated to a same edge. Usually, E, which is an embedding, is a partial function mapping darts to a finite set of integers, characters or vectors.

The encoding of a graph by such a map is performed by representing each branch by two darts defining one edge (a cycle of Q). The orientation of branches, around branching points, is explicitly encoded by the cycles of permutation S. To attach features to a combinatorial map encoding a graph, a set of node and edge labels (V and E) can be defined, wherein each node and edge label being respectively associated to a single cycle S and Q of the map.

FIG. 4A shows an example of an implementation of the process 230 for a fixed point free involution as an integer code. FIG. 4B shows an implementation of a process 230 (reverse) that reverses the process 230 by transforming back from an integer code into a fixed point free involution. The process 230 is described herein using the logic of Prolog (the computer programming language) to clearly indicate the relationships between inputs and outputs of the steps 410, 412, 414, 416, and 418. As indicated in FIGS. 4A and 4B certain steps are nested inside other steps. Accordingly, the steps are progressively refined starting with the outer steps and progressing to the inner nested steps. A relation definition is specified as the head of a Prolog clause (located before the ":-" symbol), and the relations refinement to a conjunction of relations is provided after the ":-" symbol. Multiple clauses (also called "rules") are used to specify different situations to which a predicate applies. A fixed-point-free involution groups the set of numbers from 0 to 2n−1 in pairs of two, such that the first is strictly smaller than the second. An example is [0-4, 1-3, 2-5]. It is also assumed that the pairs of number are canonically represented as sorted in increasing order by their first element.

Step 410 describes a bijection from a fixed point-free involution to a natural number code. Step 410 encodes a fixed point-free involution, represented as the list Is as a unique integer code. After determining the length L of the involution Is, step 410 generates consecutive integers Ns from 0 to 2*L, to which the transformation described as follows: given the consecutive numbers Ns from 0 to 2*L where L is the length of the involution Is, we call involutions_codes to associate involution codes Ks to each pair in Is, then we reverse the resulting list and build a bijective encoding for it using bij_encode.

In the Prolog predicate "inv2code" a fixed-point-free involution, represented as the list "Is" is encoded as a unique integer, which is referred to by the variable "Code." After the length L of the involution "Is" is computed the predicate "inv2code" generates consecutive integers Ns from 0 to 2*L, to which the transformation described by the 3-argument predicate "inv2code" is applied. These functions can be performed by described by the Prolog code given by

```
inv2code( [ ] , 0) .
inv2code (Is, Code) : -Is = [_ | _] ,
    length (Is, L) ,
    L2 is L * 2,
    range (0, L2, Ns) ,
    inv2code (Ns, Is, Code) .
```

Further Step 410 computes an integer code for an involution "Is", given the list of consecutive numbers Ns from 0 to 2*L (where L is the length of the involution "Is"). To perform this computation step 410 calls the predicate "involution_codes" in step 412 to associate involution codes Ks to each pair in "Is", then step 410 reverses the resulting list and builds a bijective encoding by using "bij_encode" in step 414. An example of Prolog code that can accomplish this is given by

```
inv2code (Ns, Is, Code) :-
    involution_codes (Ns, Is, Ks) ,
    reverse (Ks, Rs) ,
    bij_encode (Rs, Code) .
```

Step 412 generates an involution on the set of numbers between 0 and 2n−1 as a set of n pairs. These numbers each correspond to an edge made of 2 darts. Step 412 also stores in memory the codes K and Ks used to pick the darts. Step 412 can be performed by the Prolog predicate

```
involution _ codes( [ ] , [ ] ) .
involution _ codes ([X | Xs] , [X − Y | Invs] , [K | Ks]) : −
    nth0 (K, Xs, Y, Ys) ,
    involution _ codes (Ys, Invs, Ks) .
```

This predicate "involution_codes" uses a Prolog built-in operator "nth0" to extract the tt K-th element Y of the list Xs and return the remaining elements Ys.

Step 414 is performed by using a notation similar to factoradics. Given that there are 1*3*5* . . . (2n−1) fixed-point-free involutions, the fixed-point-free involutions can be encode using a notation (somewhat) similar to factoradic numbers. However, instead of actually using factoradics, a similar notation, using bijective base-k encodings is used.

Bijective numeration can be any numeral system in which every non-negative integer can be represented in exactly one way using a finite string of digits. The Bijective numeration name derives from this bijection (one-to-one correspondence) between the set of non-negative integers and the set of finite strings using a finite set of symbols.

A bijective base-k numeration is a bijective positional notation. Bijective base-k numeration can use a string of digits from the set $\{1, 2, \ldots, k\}$ (where k≥1) to encode each positive integer; a digit's position in the string defines its value as a multiple of a power of k. This notation can be referred to as the k-adic.

The bijective encoding of step 414 is ensured by incrementing the base by 2 at each step, to match the increment by 2 in the product 1*3*5 . . . *(2n−1) that counts the involutions, this function is performed by the predicate "bij_encode_step," which is called by the predicate "bij_encode_step" and both predicates are discussed below. At each step the bijective base is incremented by 2 and the integer code is extended by the operation of the predicate "put_b-digit" of step 418 as indicated by the Prolog code provide below.

```
bij _ encode(Xs, R) : -bij _ encode _ step (Xs, 1, R) .
bij _ encode _ step( [ ] , _, 0) .
bij _ encode _ step ([X | Xs] , B, R) : -
    B2 is B + 2,
    bij _ encode _ step (Xs, B2, S) ,
    put _ bdigit (B, X, S, R) .
put_bdigit(B,D,N,NewN):- D >= 0,D<B,NewN is 1+D+B*N.
% range(Min,Lim,Ns): generates list of ints >= Min and < Lim
range(_Inc,I1,I2,Is):-I1>=I2,!,Is=[ ].
range(Inc,I0,I,[I0|Is]):-I0<I,I1 is I0+Inc,range(Inc,I1,I,Is).
range(Min,Lim,Ns):-range(1,Min,Lim,Ns).
```

As an example of results generated by processes 230 and 230 reverse, below are the integer code and the corresponding fixedpoint free involutions for integer codes from 0 to 10 and from 83 to 100. These results were obtained using the Prolog code described herein and demonstrate that the Prolog is correct and operational. Note that the pairs From-To are such that From<To as the darts are seen as symmetric and as such the other direction is implicit.

0=0+[ ]

1=1+[(0−1)]

2=2+[(0−1),(2−3)]

3=3+[(0−2),(1−3)]

4=4+[(0−3),(1−2)]

5=5+[(0−1),(2−3),(4−5)]

6=6+[(0−1),(2−4),(3−5)]

7=7+[(0−1),(2−5),(3−4)]

8=8+[(0−2),(1−3),(4−5)]

9=9+[(0−2),(1−4),(3−5)]

10=10+[(0−2),(1−5),(3−4)]

83=83+[(0−5),(1−3),(2−4),(6−7)]

84=84+[(0−5),(1−3),(2−6),(4−7)]

85=85+[(0−5),(1−3),(2−7),(4−6)]

86=86+[(0−5),(1−4),(2−3),(6−7)]

87=87+[(0−5),(1−4),(2−6),(3−7)]

88=88+[(0−5),(1−4),(2−7),(3−6)]

89=89+[(0−5),(1−6),(2−3),(4−7)]

90=90+[(0−5),(1−6),(2−4),(3−7)]

91=91+[(0−5),(1−6),(2−7),(3−4)]

92=92+[(0−5),(1−7),(2−3),(4−6)]

93=93+[(0−5),(1−7),(2−4),(3−6)]

94=94+[(0−5),(1−7),(2−6),(3−4)]

95=95+[(0−6),(1−2),(3−4),(5−7)]

96=96+[(0−6),(1−2),(3−5),(4−7)]

97=97+[(0−6),(1−2),(3−7),(4−5)]

98=98+[(0−6),(1−3),(2−4),(5−7)]

99=99+[(0−6),(1−3),(2−5),(4−7)]

100=100+[(0−6),(1−3),(2−7),(4−5)]

The reverse of process 230 can be performed by process 230 (reverse), which can be performed using the Prolog predicates give below

```
code2inv(0,[ ]).
code2inv(Code,Is):-Code>0,
    code2inv(Code,Ns,Is),
```

-continued

```
        length(Is,L),L2 is L*2,
        range(0,L2,Ns).
   code2inv(Code,Ns,Is):-
        bij_decode(Code,Rs),
        reverse(Rs,Ks),
        involution_codes(Ns,Is,Ks).
   bij_decode(N,Cs) :- bij_decode_step(N,1,Cs).
   bij_decode_step(0,_,[ ]).
   bij_decode_step(N,B,[D|Ds]):-
        get_bdigit(B,D,N,M),
        B2 is B+2,
        bij_decode_step(M,B2,Ds).
   get_bdigit(B,D,N,NewN):-N>0,
        Q is N // B,
        D0 is N mod B,
        ( D0 =:= 0 -> D is B-1, NewN is Q-1
        ; D is D0-1, NewN is Q
        ).
```

In addition to the above described method of determining an integer code to be the Gödel number representing a graph or a G-Map. Cantor pairing can also be used as an example of number composition to consolidate a list of numbers such as the list of darts, permutations and involutions to a single Gödel number. For example, the pairing function, p(x,y) that maps two numbers, x and y, bijectively into a single number can be given by $$p(x,y)=2^x(2y+1)-1$$

and can also be reduced to a simpler bijection which is one solution Diophantine equation as $$q(x,y)=2^x(2y+1).$$

Multisets and sets can be recursively transformed by number composition of pairs of numbers into a single number from a list of numbers to a single number. Additionally, because the pairing function is bijective the reverse process can be performed to obtain a list of numbers using pairwise differences. If the list of numbers is long, the resultant single number from performing pairing functions can be very large, as a result of tower of exponential powers. In some cases the resultant Gödel number from the list of numbers will be too large to store or process using conventional computing hardware. In these cases, representing the Gödel number as a tree based number can be advantageous. Tree numbers provide a succinct representation of these data types. These encodings/decodings of lists, sets and multisets as tree numbers are size-proportionate so that their representation sizes are within constant factors. Thus, the encodings of the methods described herein can be both bijective, due to the bijective nature of the paring functions, and size-proportionate, due to the use of tree-based numbers, which conventionally has been a difficult combination to achieve. Achieving both aspects of being bijective and size proportionate, the methods described herein are well positioned to explore and mine data structures having a very rich combinatorial information. Combinatorial graphs corresponding to very rich combinatorial tree structures (i.e. there is a very large number of trees of a given size) which are transformed to Gödel numbers using conventional mainstream method tend to explode exponentially since encoding of long symbols can place relatively large numbers at the leaves of a tree which will increase very quickly when propagated up.

Tree-based numbers for size proportionate representation of Gödel numbers is discussed in detail below. Also, pairing functions are discussed below in relation to generating Gödel numbers and performing submap matching on term-algebra terms. Here, it is mentioned that a term-algebra term can be a nested function such as "$f(X, g(a, 0, X), [1,2])$," wherein the arguments of the function $f$ are X, g(a, 0, X) and [1,2]. Further, one of the arguments g(a, 0, X) of $f$ is itself of function, which has arguments a, 0, and X. This function can, like the G-Maps discussed above, be represented using a term tree, in which the primary function is the root, the branches are the arguments, and the branches corresponding to functions such as g(a, 0, X) have branches directed from a node at the end of the branch. Thus, similar method to the methods described above can be applied to these term-algebra terms. For example, as discussed in P. Tarau, "Compact Serialization of Prolog Terms (with Catalan Skeletons, Cantor Tupling and Gödel Numberings)," Theory and Practice of Logic Programming, vol. 13, no. 4-5, pp. 847-861, (2013), incorporated herein by reference in its entirety, the function "$f(X, g(a, 0, X), [1,2])$," can be bijectively encoded as the natural number 6785479168905137351160760, such that the operations of encoding and decoding operations respectively generate the results encodeTerm($f(X,g(a,0,X),[1,2]),N$),
  N=6785479168905137351160760, decodeTerm(6785479168905137351160760,$T$).

$T=f(A,g(a,0,A),[1,2])$

Having encoded the G-Map as a Gödel number, process 230 is complete and process 110 is also complete. The method 100 proceeds from process 110 to process 120. Process 120 performs a unification process that includes comparing candidate submaps of the G-Map to determine isomorphism. Whereas the isomorphism problem can approached using a method based on the A* algorithm, an approximate method using Greedy algorithms, or kernel functions, the method described herein uses a combination of:

(i) decomposition into a set of patterns based on neighbor-adjacency relationships at successively higher orders (point to point, point to edge, edge to edge, edge to face, face to volume, etc. . . . );

(ii) a novel recursive tree based numbering applied to such patterns as a local map and their composition into a global map that represents a graph; and (iii) candidate selection which corresponds to sub-isomorphisms between locales which are indexed by their patterns: the largest locale, which is the total map, is a graph isomorphism while the smaller locales are sub-isomorphisms.

Thus, method 100 is expressive, efficient, positive definite and applicable to any graph. Process 120 of method 100 distinguishes between substructures that the usual graph walk kernel deems identical. The submap kernel on graphs is a sum of submap kernels on nodes. Accordingly computing complete graph kernels, subgraph kernels, and the path kernel is intractable, unless and if and only if the feature space be made up of graphs homomorphic to subgraphs. Hence, a pattern set dictionary is used in process 120. Using conventional methods, even for relatively small subgraphs, most graph kernels still require significant computational overheads and require days on a standard laptop: method 100 is orders of magnitude faster.

Figure 5:
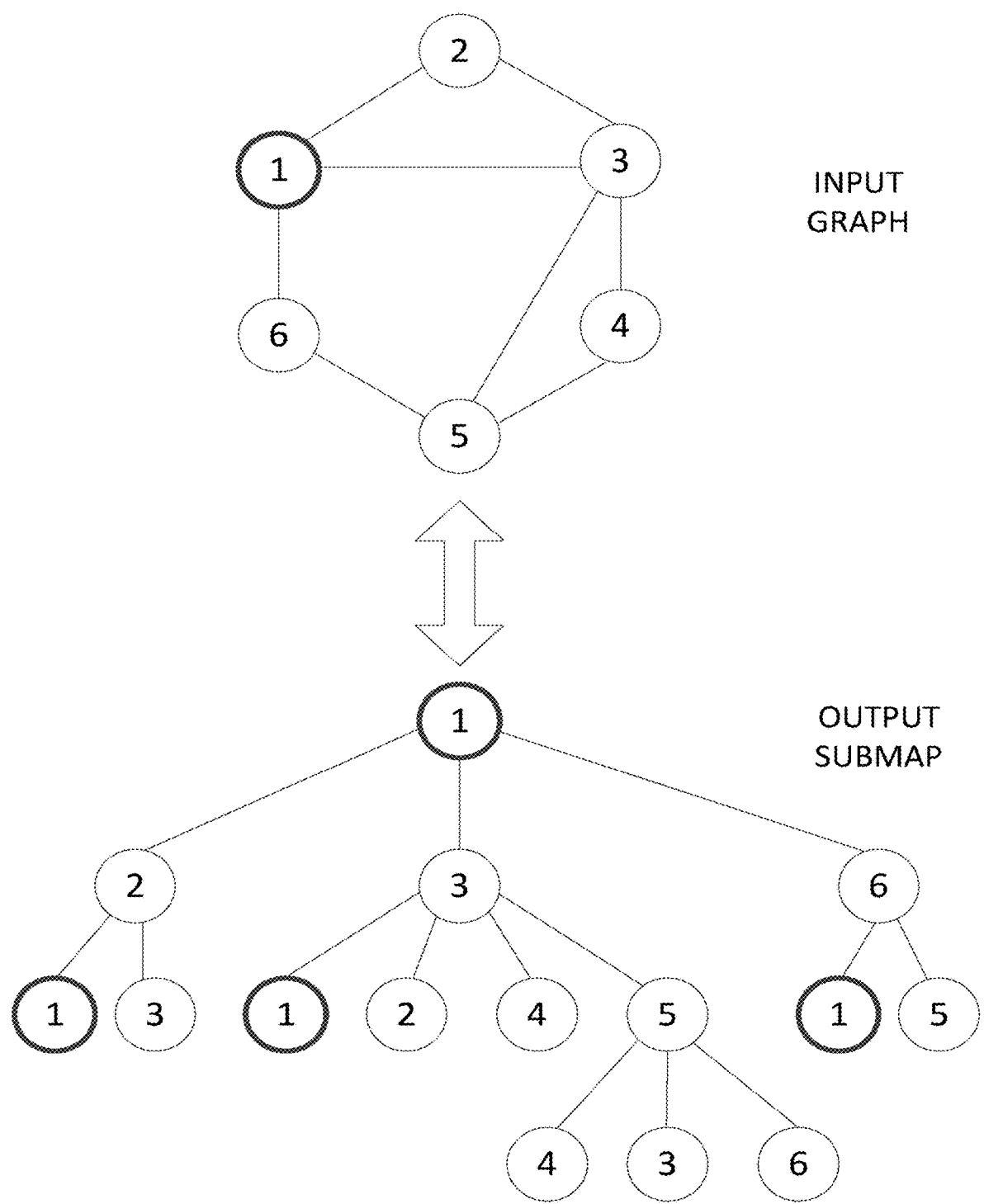
FIG. 5 shows a transformation from a graph (input graph) to a term tree (output submap), according to one implementation.
Figure 6:
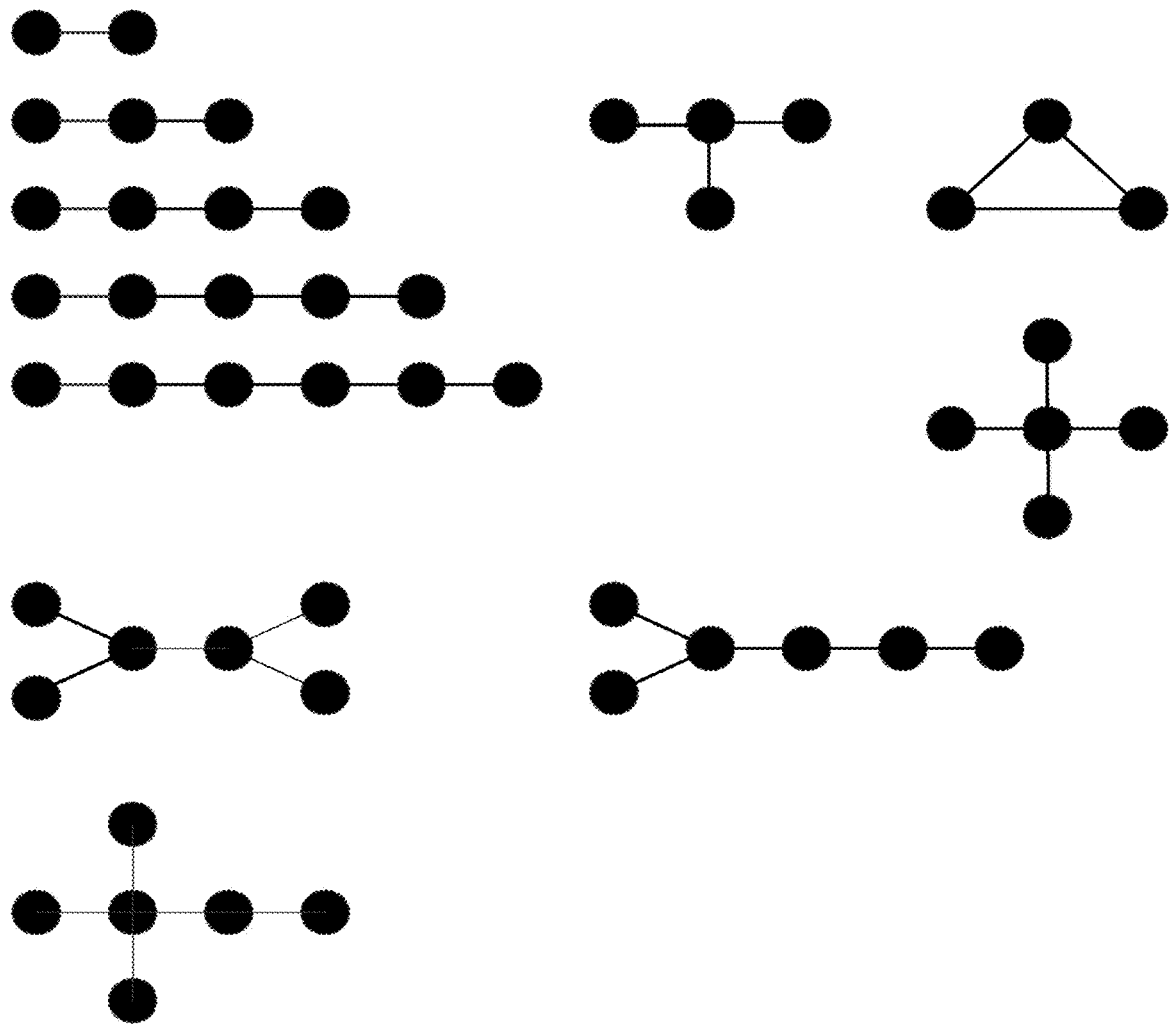
FIG. 6 shows an example of submaps forming a dictionary of basic compositional patterns, according to one implementation.

Process 120 can be performed by defining a kernel to decompose the G-Map into basic compositional patterns by determining term trees called submaps corresponding to sub G-Maps of the G-Map and rapidly comparing the submaps using their respective Gödel numbers. FIG. 5 shows an example of a transformation from a sub G-Map (i.e., input graph) to generate a term tree (i.e., output submap). The kernel between G-Maps is based on their decomposition into submaps represented by term trees of limited size, and each tree being encoded using a sub G-Map. Accordingly, a kernel is defined between G-Maps based on a decomposition of each G-Map into a bag of submaps (i.e., term trees representing various sub-G-Maps of the G-Map). The submaps form a dictionary of basic compositional patterns. FIG. 6 shows an example of the dictionary of basic compositional patterns.

Patterns are extracted using a depth first search strategy from each node where the valence of the node corresponds to the valence of the pattern. Therefore, each G-Map is represented by decomposition into submaps represented by term trees (i.e., submaps) of a limited size on which a kernel algorithm is specified.

Figure 7:
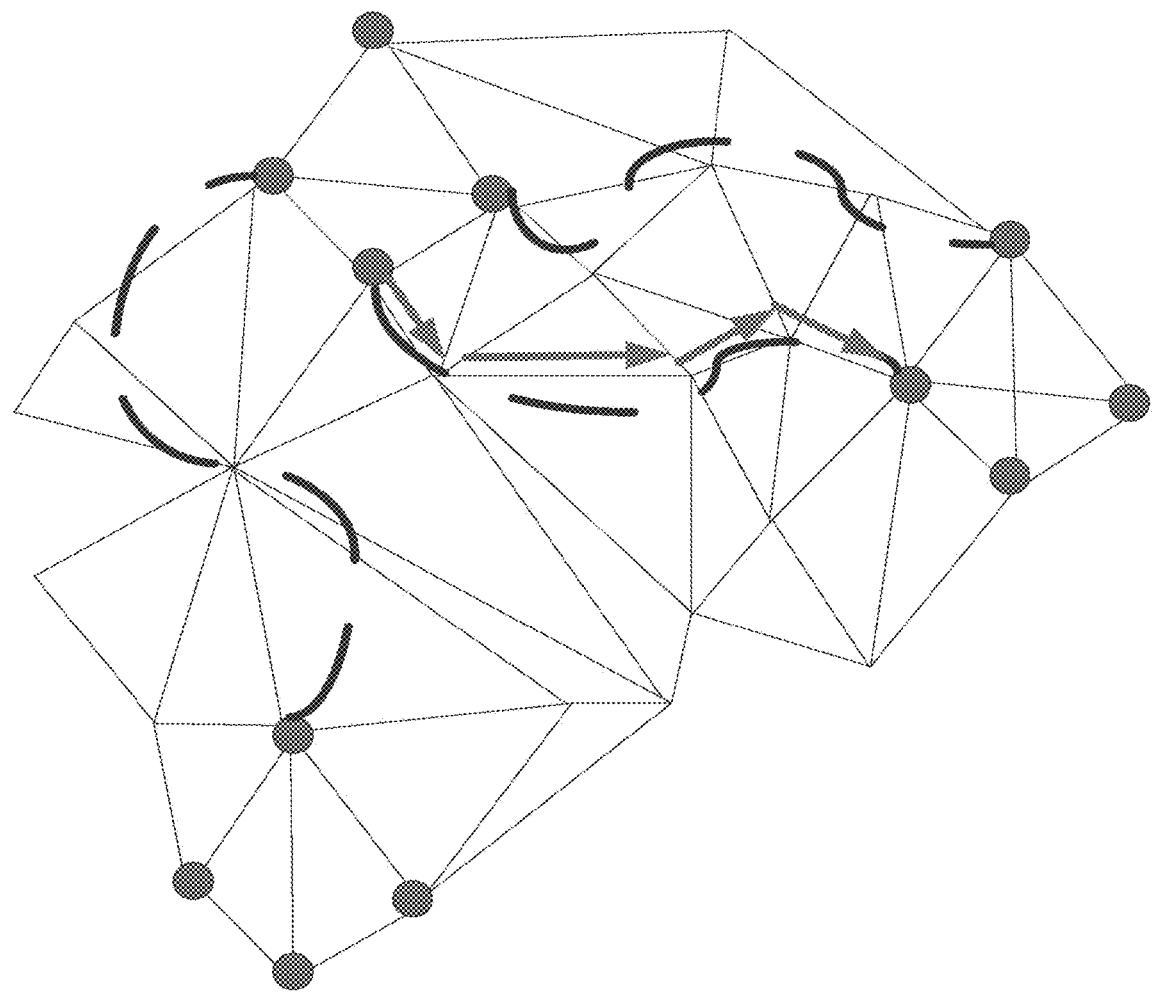
FIG. 7 shows an example of a dual step algorithm that iteratively encodes and traverses locales to perform unification on isomorphic submaps (i.e., sub-graphs), according to one implementation.

Each k-dimensional complex in a G-Map has a locale. So edges can have locales such as edge-adjacent faces. Or faces can have locales such as face-adjacent hyper-volumes. The methods described here use a dual step algorithm that iteratively encodes and traverses locales. When locales unify structurally, then the graphs are isomorphic to the level of the matching locale (i.e. sub-graphs). FIG. 7 shows an example of the dual step algorithm that iteratively encodes and traverses locales.

Each k-cell in a G-Map has a locale, which was previously defined as the arrangement of darts around a cell based on the involution operation. For example, a 0-cell in a G-Map, which would correspond to a node in the graph, would have edges as locales, which are all the edges formed by the adjacent nodes. Each of these locales are assigned an index, based on the topological indices at each of the cells in the G-Map. The index can be computed using an encoding algorithm, such as Lehmer codes, that would preserve the unique structure and content of each of the cells comprising the locale. The Lehmer codes are used to encode the permutations.

Generally for the process of unification, process 120 begins with the assumption that the G-Maps are isomorphic at the highest common dimension available in the graphs. If the indices at the locales for the k-dimensional complex in the compared graphs are equal, then the sub-graphs for the locales are structurally equivalent. If process 120 does not find a structural match for locales at dimension k, then all locales at dimension k−1 are considered, and so forth until locales at dimension 0 are considered.

Details of the process 120 are now described. A term-algebra term, usually representing some features or representation of data, information or knowledge, can be embedded into the combinatorial map encoding a skeleton by mapping the term-algebra into a unique tree-number. In order to accomplish the embedding of the tree numbers representing the term-algebra, we define a set of node and edge labels (V and E), where each node and edge label is associated to a single cycle permutation whose cycles correspond to the sequence of darts encountered when turning counter-clockwise around each node as well as a permutation that explicitly encodes the orientation of edges around each node: the produces a numeric-code which is also represented as tree-number.

As has been made clear in the foregoing, Generalized Combinatorial Maps (G-Maps) are topological and combinatorial data structures that are based on the concept of encoding permutations of relative adjacency relationships between primitive elements called darts.

The methods described herein use two kinds of darts: a half-edge dart and an empty dart. Empty darts can be used to define partial combinatorial maps or partial structures in which the algorithms depend on the incident pairs of objects being either unsewn to convert cycles into trees or, vice-versa, to add darts to convert trees into cycles. Also empty darts can fill in the "blanks" to complete the structures for the purpose of the algorithm of the present embodiments of the invention. Between darts, an adjacency relationship exists that is defined by dimensionality, with the empty dart having no defined dimensionality (i.e., not zero but undefined and the empty dart is marked specially whenever it is needed, which, usually is very rarely).

A single half-edge dart has a dimension of zero. The dimensionality of a k-dimensional cell can be referred to separately and distinctly from the object, which has dimension N that the dart may be a part of. Therefore, $k=\dim(c)$ denotes the dimension of the cell c and N denotes the dimension of the object. Also, a 0-cell is a vertex, a 1-cell is an edge, a 2-cell is a polygon, a 3-cell is a polyhedron on so forth. Table 1 provides a list of correspondences between graph elements and G-Map elements and their corresponding involutions. Darts are either sewn together, or unsewn when separated, and, in the case of adjacent faces, the "shared" edges are separated such that each face has its own set of darts defining it. Sewing darts together is defined by a permutation operation, and the permutation operator builds the combinatorial maps from darts.

Figure 8:
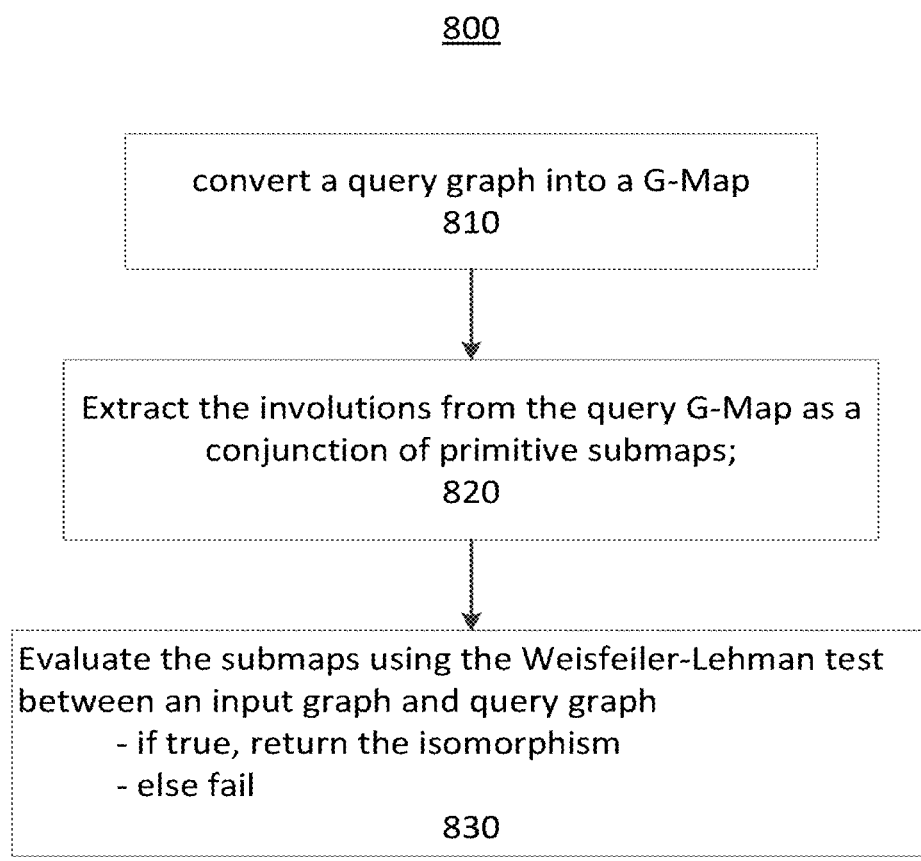
FIG. 8 shows a flow diagram of a method of evaluating isomorphism between submaps, according to one implementation.

Darts, as described herein, have two other properties. First, the darts are uniquely labeled using integers. Secondly, the darts are pointers to other data which is usually content of some kind (for example, the names of people in a social network, or the names of atoms in a protein structure). As pointers, darts can embed various kinds of data. A single-dart implicitly defines a node and the embedding of the dart defines the data contained in the node, which may include other combinatorial objects or maps. The topological structure of the map is, therefore, distinct from the embedding which may serve to connect features of geometry or shape to the underlying topology or skeleton The unification process in 120 includes evaluating the submap isomorphism between a query graph and an input graph. FIG. 8 shows a process 800 for performing the submap isomorphism evaluation. Using the above-described methods a G-Map can be encoded using Gödel number and using the tree-based numbering. Further, term-algebra terms can be embedded at the nodes of the vertices or edges using the darts on which we can specify open and closed (orbits) as the fixed-point free involutions on the darts. For example, in terms of the darts, triangles are the minimum closed structures, and edges are the minimum open structures. Given that darts describe a node in terms of their neighboring darts by way of involutions, such that cycles determine closed structures, it is possible to reconstruct the graph from the combinatorial map by tracing back the involutions of the darts regardless of the graph size, type and form as partial submaps;

The given darts and their associated sub-structures (submap and edges) have a strict ordering (i.e., orientation). Thus, a unique oriented graph can be assembled from the ordered darts, and this unique oriented graph is always the intended (sub)graph. Therefore, to find the submap isomorphism step 810 of method 800 converts a query graph into a G-Map.

Next, step 820 of method 800 extracts the involutions from the G-Map corresponding to the query graph as a conjunction of primitive submaps (i.e. a decomposition of size "k" representing a submap as subtree or cycle or submap).

In step 830 of method 800, the isomorphism between the submaps of the input graph and the query graph are evaluated using the Weisfeiler-Lehman test. If the Weisfeiler-Lehman test indicates that the submaps are isomorphic then a value of true is returned. Otherwise a value of false is returned.

The comparison is not only performed once but is repeated multiple times using the dual step algorithm to iteratively encode and traverse locales comparing various submaps of both the input graph and the query graph. The database of basic compositional patterns can be defined by the compilation of input graphs into primitive submaps. The query submaps en use variables for darts such that the submap is a query schema. The search proceeds by unifying submap schemata with query G-Maps from the database based on the sub-submappings of darts using the Weisfeiler-Lehman test.

Figure 9:
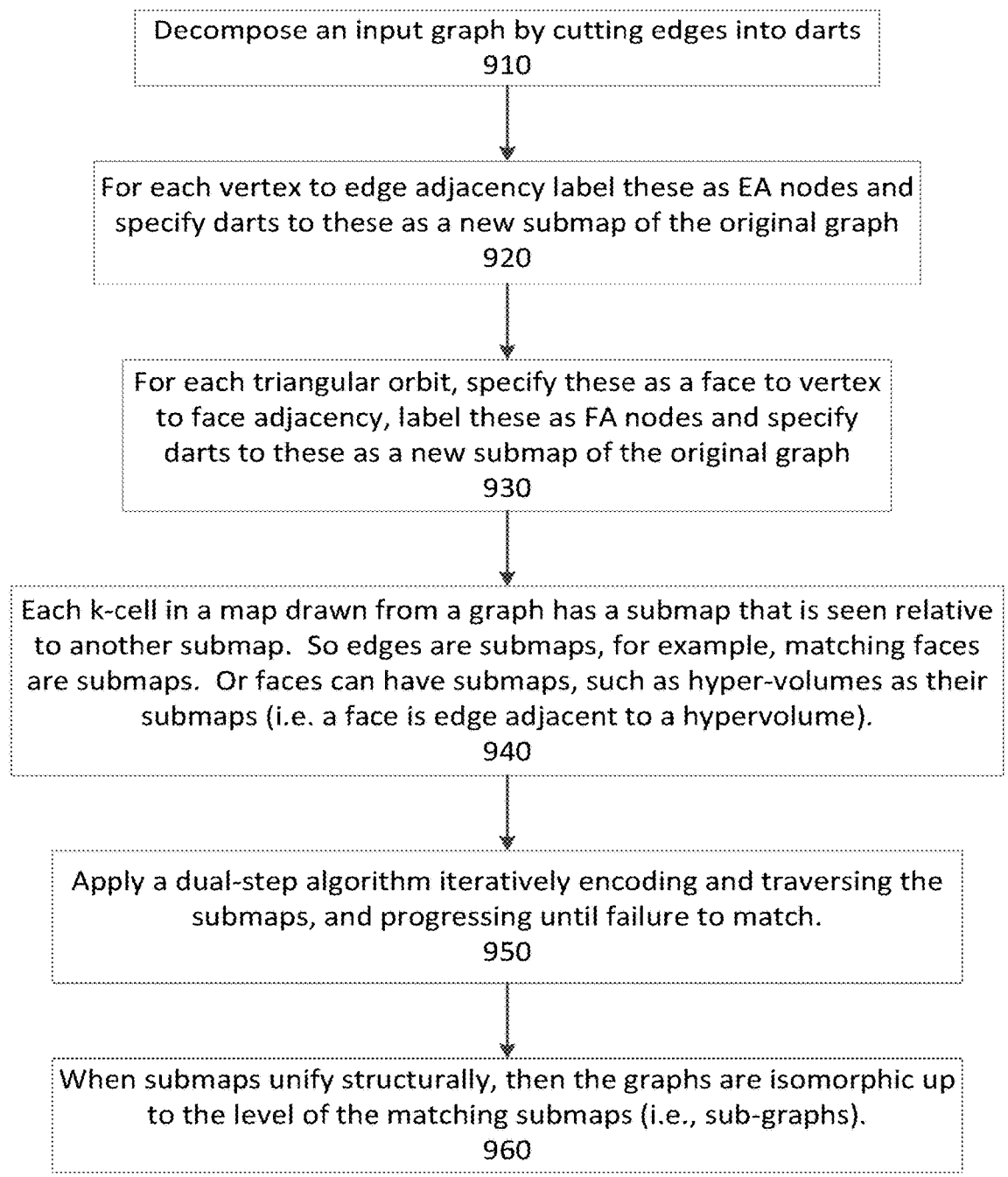
FIG. 9 shows a flow diagram of a method of evaluating isomorphism between submaps, according to one implementation.
Figure 10:
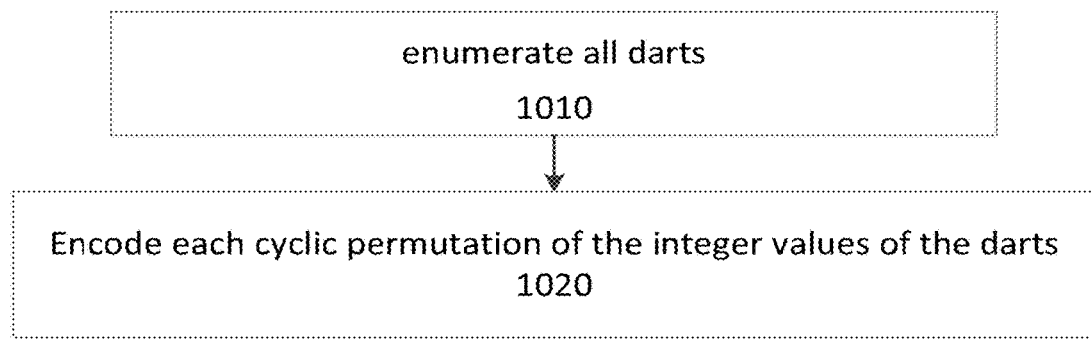
FIG. 10 shows a flow diagram of a method to label darts of a combinatorial hypermap, according to one implementation.

To aid the search, a search index can be assembled using the method 900 shown in FIG. 9. A search index is built based on the encoding of the matching submaps to the identity of the graphs and the set of the index submaps is used for processing further queries without the step of unification required by the Weisfeiler-Lehman test.

In step 910 of method 900, decompose an input graph by cutting edges into darts;

In step 920 of method 900, for each vertex to edge adjacency label these as EA nodes and specify darts to these as a new submap of the original graph.

In step 930 of method 900, for each triangular orbit, specify these as a face to vertex to face adjacency, label these as FA nodes and specify darts to these as a new submap of the original graph.

In step 940 of method 900, each k-cell in a map drawn from a graph has a submap that is seen relative to another submap. For example, edges are submaps. Additionally, matching faces are submaps. Further, faces can have submaps, such as hyper-volumes as their submaps (i.e., a face is edge adjacent to a hypervolume).

In step 950 of method 900, a dual-step algorithm is applied to iteratively encode and traverse the submaps, and progressing until failure to match.

In step 910 of method 900, if the submaps unify structurally, then the graphs are isomorphic up to the level of the matching submaps (i.e., sub-graphs).

Method 900 provides the search index for which submaps of the input graph are to be compared with the query graph. Method 800 complements method 900 because method 800 provides instructions about how to compare the submaps of the input graph with the query graph, but does not include instructions about which submaps are to be compared. Accordingly, methods 800 and 900 work together to perform functions of process 120.

Additionally, the methods described herein can be used with graph representing network flows. Network flows (i.e., graphs that have edges containing a directed flow) are represented by pairs of four darts and graphs are represented by a pair of darts. Let X be a finite set, and K the Klein group of four elements which are denoted by 1, a, b, and c where c=ab. For X E X, the set Kx={x, ax, bx, cx} is said to be a quadricell. The basic element of a map is called a dart, and each directed edge is composed of four darts with different side and direction. For undirected maps, a pair of darts representing an edge is sufficient. A combinatorial map M representing network flows can be expressed using a triplet (X, P, K) in which X is a finite set of darts. A single "edge" map is therefore represented by four darts. A vertex of a graph is described by the cyclic permutation of the darts about it: Therefore a cyclic permutation description of a map is a sequence composed of an oriented traversal of darts of all vertices in a map. In general, there are usually many cyclic permutations, all different, that can be written to describe a given map. Therefore, the map is a combinatorial structure made up of permutations and these permutations are encoded in the present invention by method 1000.

In step 1010 of method 1000, all of the darts are enumerated using unique integers as labels.

In step 1020 of method 1000, encode each of the cyclic permutation of the integer values of the darts according to the formula $a^2=b^2=c^2=1$ and c=ab=ba, wherein H is a permutation on v such that each orbit of P consists of conjugate pairs as $(x, Px, \ldots, Pix)$ and $(ax, aP\_1x, \ldots, aP\_ix)$ for iP0 and that the group generated by $\{P, a, b\}$ is transitive on v.

As discussed above, term-algebra terms can be encoded using method 100. Thus, instead of step 110 encoding graph data into an integer code, a function that is a term of a term algebra (hereinafter a term-algebra term) is encoded using a Gödel number. Further, the comparison between submaps (i.e., term trees) is a comparison between arguments and arguments of arguments of the function. For example, the function f(X, g(a, 0, X), [1,2]), is a term-algebra term and if f(X, g(a, 0, X), [1,2]), were expressed as a term tree, then g(a, 0, X) would correspond to a term tree that would be a submap of f(X, g(a, 0, X), [1,2]). Further, X is an argument of f(X, g(a, 0, X), [1,2]), and X is also an argument of an argument of f(X, g(a, 0, X), [1,2]). Therefore, a term-graph derived from the term tree of f(X, g(a, 0, X), [1,2]) would cyclical.

Figure 11:
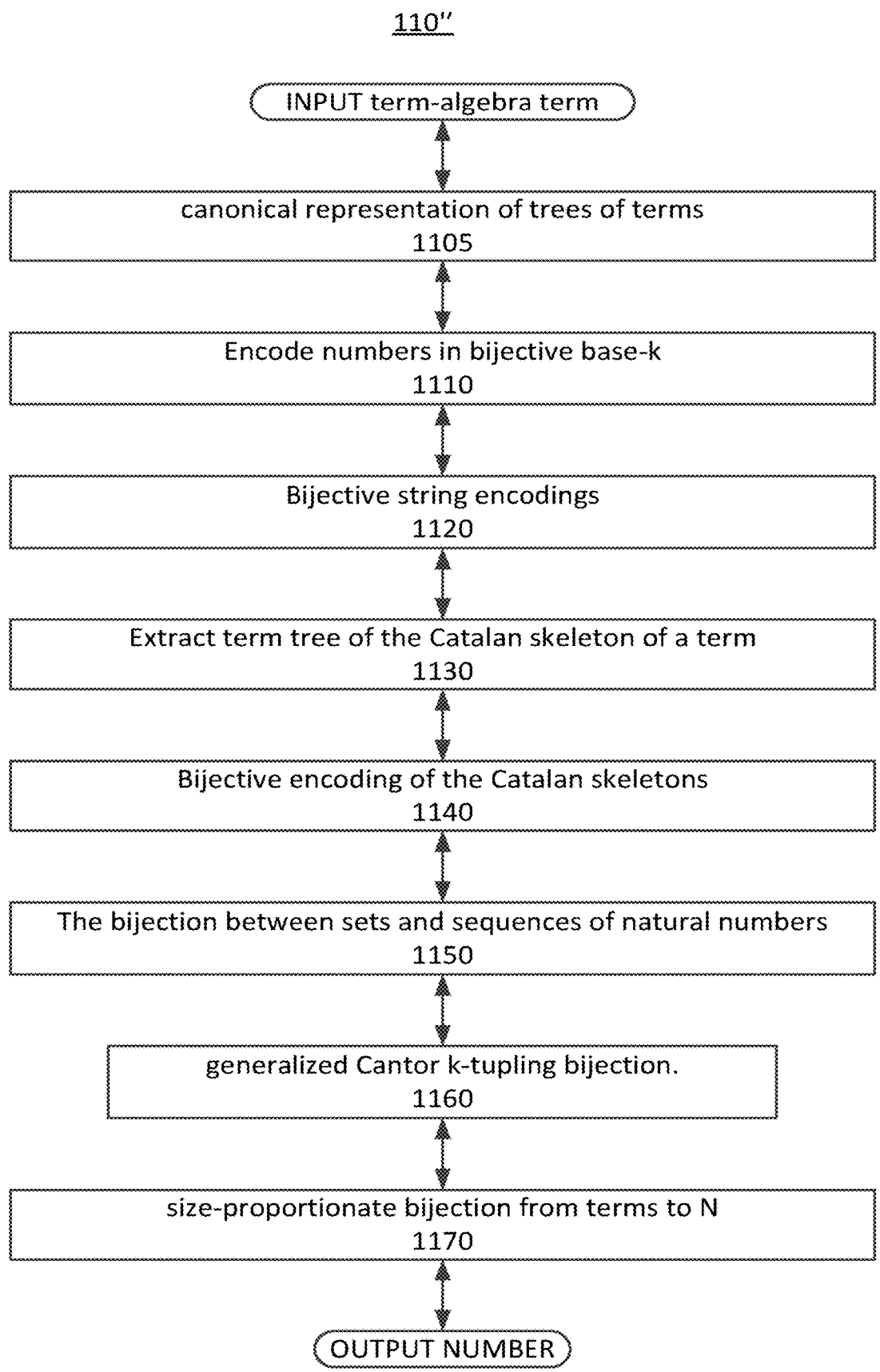
FIG. 11 shows a flow diagram of a method to bijectively encode a term-algebra term as a natural number or a tree-based number, according to one implementation.

FIG. 11 show a process 110" corresponding to process 110 of method 100 when term algebras and not graph data is used. Step 1105 of process 110 is generating a canonical representation of trees of terms. FIG. 12 shows that a function (e.g., f(a, g(b, X), h(X, 10))) can be broken up into two parts. The first part being a parentheses structure (i.e., the skeleton) representing the structure of the arguments. The second part being the content.

In step 1110, the content is encoded using a bijective base-k. As indicated in FIG. 12, strings can be represented as numbers in bijective base-k where k is the size of the alphabet. Hence a bijection between a word, a list of its alphabet as ascii codes, can be used to derive and a number N by performing number composition (e.g., using the cantor paring function discussed above) on the ascii codes, as indicated in FIG. 12. In step 1120, the bijective encoding of the string of ascii codes are consolidated into a single number.

In step 1130, the Catalan skeleton represented by parantheses is translated into a term tree as shown at the bottom of FIG. 12.

In step 1140, bijective encoding of the Catalaon skeleton is performed. For example, this bijective encoding can be a fixedpoint free involutions are calculated for the Catalan skeleton term.

a bijective encoding of the Catalan skeleton term tree is performed generating a single number that represents the Catalan skeleton term tree.

In step 1150, numerical composition of the number pairs of the fixedpoint free involutions, for example, is performed to generate a single natural number representing the topology of the Catalan skeleton.

In step 1160, a single natural number is generated by combining the natural number representing the content (also referred to as the symbol sequence) with the natural number representing the topology of the Catalon skeleton, using a pairing function, such as the Cantor pairing functions discussed above.

In step 1170, the single natural number from step 1160 is represented as a tree based number.

representing the content (the content can also referred to as the symbol sequence) is combined with the natural number representing the topology of the Catalon skeleton.

The functions of process 110″ can be performed by an operator encodeTerm that performs the pseudocode ---
encodeTerm: Input a Term Tree, Output a Code
---
convert term to binary parenthesis language, Ps,
   as a topology and symbol table, Xs
convert Ps to Catalan Code, Ns
convert Xs to Goedel Code, G
use pairing function to convert Ns to N5.
pair N and G to output Code

---

To determine isomorphism between term-algebra terms, the topology of the term-algebra terms can be expressed in a term tree and the nodes of the term tree can include pointers to the corresponding content, similar to the darts of the G-Maps including pointers to objects. Further, term-graphs, similar to G-Maps can be generated for the term trees of the term-algebra terms. Thus, data can be embedded into the map and represents a term-algebra Term. Each functor is replaced by a vertex, and the arguments by darts about the vertex. Nested terms mean that some darts share a vertex. For each unique set of atoms, a labeling of integers is performed that is unique.

A term-graph is a combinatorial data structure that is dynamically compiled at runtime, from standard term-algebra term-trees which have been represented as a combinatorial map. The term-algebra term tree is converted into a unique integer map where each element is encoded as a natural number, and each natural number represents a branch of the term-tree. The term tree, an integer structure, is distinct from the term-algebra term but is an equivalent rewriting and is dynamically reduced and precompiled into a term graph. The term graph is represented as a connected map of numbers which form the embeddings of darts to the original symbolic terms from whence they originated.

A canonical protocol for labeling and representing a map is used to overcome the diversity of cyclic permutations that can be used to describe a map. When a dart is embedded with a symbol S (e.g., the content), other darts sharing the same edge can also be embedded, and described by using S. A breadth-first traversal of a given map will add symbols of visited darts into a symbol sequence that is stored in a queue according to the visit order. The method for determining dart label is shown in FIG. 13 using pseudo code.

This representation enables a symbol sequence to be stored as a term and terms unifying with other symbol sequence sets becomes equivalent to map unification. The number of symbol sequences, and therefore, natural numbers, based on the combinatorial nature of the map grows exponentially and therefore simple unification is infeasible. Accordingly, the symbol sequences in a submap sequence set can advantageously be organized as a term-graph.

Next a definition of properties and relations of a term tree is provided. Given a map M and the corresponding sequence set represented as a the combinadic number D(M) of a submap, the term-tree of M, denoted as TT(M), is a rooted tree of combinadic-numbers such that: 1) each node in this tree is associated with a combinadic number representing a symbol sequence (the structure looks like a brush or bushy graph) denoted as sv; 2) let each edge in TT(M) be directed from the parent to the child; 3) each Path from the root to a node, say v, is associated with a natural number encoding of the symbol sequence from root to node; 4) for any node v in this tree, the numbers associated with the children of v are different from each other; 5) for any combinadic number s in D(M), there is a node v in this tree such that s=sv; 6) for any node v in this tree, if sv is a regular sequence then there is a natural number s in D(M) such that s=sv; 7) two paths are equivalent if the two symbol sequences represented by natural numbers associated with them are equivalent; 8) for any two nodes u and v in TT(M) such that the subtrees Tu and Tv are equivalent, remove Tu from TT(M) and add one edge from permutation of u to v; 9) given a map M and term-tree TT(M) and the term-graph TG(M), for any path p in TT(M), there is a path q in TG(M) such that q is equivalent to p; 10) the root of a term graph is the node without incoming edges and the first symbol of any symbol sequence of a map is '1', which is the same as the symbol associated with the root of the term graph.

Based on the above definition and description of a term tree, the term-graph representation can be written using methods 1400 and 1500, shown in FIGS. 14 and 15 respectively. Method 1400 creates a term-tree, and method 1500 creates a term-graph. Both methods 1400 and 1500 are expressed using pseudo code. Constructing the corresponding symbol tree for each model map is performed in the preprocessing.

Given a map with n edges, there are $O(2^n)$ connected submaps at most and $O(n2^n)$ numbers representing symbol sequences in the submap sequence set. Therefore, the storage complexity of the symbol graph is $O(n2^{(2n)})$ numbers in the worst case. In the average case, for structured data, where there are patterns in the data, the combinatorial complexity is much lower. Using Tree-Based numbering, and the rule for choosing the code on tree-size or bit size, the numbering will be succinct.

Method 1600 shown in FIG. 16 performs a unification process between term graphs. A term-graph can be represented by a map. The term-graph submap unification operation performed by method 1600 checks whether there is a term-subgraph of a model map M that unifies (e.g., is isomorphic) with a term-subgraph of a term-graph pattern map G. If the root of G matches the first term in the term-graph of M, and then the sub-term-graph isomorphism algorithm matches the second term in the children of the root and continues iteratively. A dual-loop is implemented in which each iterative matching operation iteratively descends the term-graph. Therefore the method 1600 works in polynomial time and its computational complexity is $O(kn)$, wherein n is the number of darts in the pattern map, and k is the maximum degree of the nodes in the term graph of the model map. The computational complexity of method 1600 is linear if k is bounded, and is $O(mn)$ in the worst case, where m is the number of darts in the model map.

Now the tree-based numbering is discussed. Tree based numbers are defined inductively as the set of terms such that:

A tree-number X is an element of the tree based numbering data type, T, if and only if X=e or X is one of the predicates: v(T, Ts) or w(T, Ts) where Ts stands for a finite sequence (list) of elements of T.

The data type is represented by the set with the following rules:
(a) The term e is the empty leaf and corresponds to zero;
(b) Define function o(x)=2x+1
(c) Define function i(x)=2x+2
(d) Define any number as the unique sequence of applications of functions o and i to e that evaluates to the number N.
(e) Define a vw-tree as follows:
  (i) Define term v(T, Ts) counts the number T+1 (as counting starts at 0) of o applications followed by an alternation of similar counts of i and o applications in Ts
  (ii) Define term w(T, Ts) counts the number T+1 of i applications followed by an alternation of similar counts of o and i applications in Ts.
(f) Define the successor and predecessor through a reversible predicate s(Pred,Succ) where Succ is the successor of Pred as follows using term-rewriting logic:

$s(e,v(e,[\ ]))$.

$s(v(e,[\ ]),w(e,[\ ]))$.

$s(v(e,[X|Xs]),w(SX,Xs)) \rightarrow s(X,SX)$.

$s(v(T,Xs),w(e,[P|Xs])) \rightarrow s(P,T)$.

$s(w(T,[\ ]),v(ST,[\ ])) \rightarrow s(T,ST)$.

$s(w(Z,[e]),v(Z,[e]))$.

$s(w(Z,[e,Y|Ys]),v(Z,[SY|Ys])) \rightarrow s(Y,SY)$.

$s(w(Z[X|Xs]),v(Z,[e,SX|Xs])) \rightarrow s(SX,X)$.

(g) The identities are:

$o^n(k)=2^n \cdot (k+1)-1$ $i^n(k)=2^n \cdot (k+2)-2$ $o^n(0)=2^n-1$ $i^n(0)=2^{(n+1)}-2$ $o^k(x)+o^k(y)=i^k(x+y)$ $o^k(x)+i^k(y)=i^k(x)+o^k(y)=i^k \cdot (x+y+1)-1$ $i^k(x)+i^k(y)=i^k \cdot (x+y+2)-2$ (h) The bijection from trees to natural numbers:

TABLE 2

| Term X is either of e or v( T, Ts) or w( T, Ts) | Formula |
|---|---|
| e | 0 |
| v(X, [ ]) | $2^{n(X)|1} - 1$ |
| v(X, [Y\|Xs]) and U = w(Y, Xs) | $(n(U) + 1) \cdot 2^{n(X)+1} - 1$ |
| w(X, [ ]) | $2^{n(X)+2} - 2$ |
| w(X, [Y\|Xs]) and U = v(Y, Xs) | $(n(U) + 2) \cdot 2^{n(X)+1} - 2$ |

Example: for a function n(T, N), where T is a term and N is a number, $n(w(v(e,[\ ]),[e,e,e]),N)=(((2^{o+1}-1+2)2^{o+1}-2+1)2^{o+1}-1+2)2^{2^{o+1}-1+1}-2$ Therefore, N=42.

Examples in terms of the o and i operators:
0=e; 1=o(e); 2=i(e); 3=o(o(e)); 4=i(o(e)); 5=o(i(e))
Examples as trees: 0=e, 1=v(e, [ ]), 2=w(e, [ ]), 3=v(v(e, [ ]), [ ]), 4=w(e, [e]), 5=v(e, [e])
Given N=20, therefore, the corresponding tree term is: w(e, [e, e, e]).
$N=2^{256}-1=2^{2^{16}}-1$ therefore, the corresponding tree term is: v(v(v(v(v(e, [ ]), [ ]), [ ]), [ ]), [ ]).
  (i) Term Tree: the following function, T(x), defines the tree representations associated to a number:

$T(x) = e$ if $x = 0$ $T(x) = o\left(t\left(\frac{x-1}{2}\right)\right)$ if $x > 0$ and $x$ is odd;

$T(x) = i\left(t\left(\frac{x}{2} - 1\right)\right)$ if $x > 0$ and $x$ is even (j) Tree transformations in terms of o and i:

$o(e,v(e,[\ ]))$.

$o(w(X,Xs),v(e,[X|Xs]))$.

$o(v(X,Xs),v(SX,Xs)):-s(X,SX)$.

$i(e,w(e,[\ ]))$.

$i(v(X,Xs),w(e,[X|Xs]))$.

$i(w(X,Xs),w(SX,Xs)):-s(X,SX)$.

(k) Multiplication of two numbers, a and b:

$o^n(a)o^m(b)=o^{(n+m)} \cdot (ab+a+b)-o^n(a)-o^m(b)$ (l) Subtraction:

if $x>y$ then $o^k(x)-o^k(y)=o^k \cdot (x-y-1)+1$ if $x>y+1$ then $o^k(x)-i^k(y)=o^k \cdot (x-y-2)+2$ if $x \geq y$ then $i^k(x)-o^k(y)=o^k \cdot (x-y)$ if $x>y$ then $i^k(x)-i^k(y)=o^k \cdot (x-y-1)+1$ It can be proved by structural induction that Peano's axioms hold, and {T, e, s} is a Peano algebra. These definitions can be, therefore, applied recursively also for the counters (i and o), until the empty sequence is reached. Therefore, all the arithmetic operations can be performed on the tree based numbering. Further, the tree-based numbering descrbied herein Contrary can advantageously handle linear combinations of towers of exponent numbers, such as $2^x-1$ when they are expanded to a large unbalanced binary tree.
  Identities of the n-iterations of o and i:

If $k>0$ then $1+o^n(k-1)=2^n k$; If $k>1$ then $2+i^n(k-2) = 2^n k$

And, $o^n(k)=2^n(k+1)-1$ where $o^n(0)=2^n-1$; $i^n(k)=2^n(k+2)-2$ where $i^n(0)=2^{n+1}-2$ And also, for k, $o^n(k)+2^n=i^n(k)+1$; $i^n(k)=o^n(k)+o^n(0)$; $o^n(k+1)=i^n(k)+1$ Given, as defined earlier in this invention, o(x)=2x+1 and i(x)=2x+2, then set $s(x)=x+1$ and $s'(x)=x-1$ where we set:

$o^n(k)=s(i^n(s'(k)))$; $i^n(k)=s'(o^n(s(k)))$

The following relate successor and predecessor to iterated applications of o and i:

$$s(o^n(k))=i(o^{s'(n)}(k)); s(i^n(k))=o^n(s(k))$$

$$s'(o^n(k))=i^n(s'(k)); s'(i^n(k))=o(i^{s'(n)}(k))$$

The tree-based numbers described herein lift tractability of computations to be limited by the representation size of their operands and not by the native processor-limited bit-sizes. The tree-based numbers are used to succinctly represent sparse or dense lists, sets and multisets. This provides bijective size-proportionate Gödel numberings of data types.

Storage and retrieval as well as transmission of data over networks will be compressed and chosen by two parameters: either by tree-size or by bit size: If the bit size is significantly larger than the tree-size then tree-based numbers will be used for the representation of the numbers that encode the data structures otherwise, ordinary bit strings will be used. In the case of tree-based numbers, a self-delimiting 3-bit code is used as follows:

TABLE 3

| BINARY CODE | REPRESENTATION |
|---|---|
| 000 | e |
| 001 | v |
| 010 | w |
| 011 | ( |
| 100 | ) |
| 101 | ⌊ |
| 110 | [ |
| 111 | , |

The code is self-delimiting because the parentheses can be counted as there is always an open-parenthesis and closed-parenthesis pair.

Each of the algorithms and processes described above and features of the invention can be implemented using some form of computer processor or processing circuitry, for example, using particularly programmed processing circuitry. The circuitry may be particularly designed or programmed to implement the above described functions and features which improve the processing of the circuitry and allow data to be processed in ways not possible by a human or even a general purpose computer lacking the features of the present embodiments. As one of ordinary skill in the art would recognize, the computer processor can be implemented as discrete logic gates, as an Application Specific Integrated Circuit (ASIC), a Field Programmable Gate Array (FPGA) or other Complex Programmable Logic Device (CPLD). An FPGA or CPLD implementation may be coded in VHDL, Verilog or any other hardware description language and the code may be stored in an electronic memory directly within the FPGA or CPLD, or as a separate electronic memory. Further, the electronic memory may be non-volatile, such as ROM, EPROM, EEPROM or FLASH memory. The electronic memory may also be volatile, such as static or dynamic RAM, and a processor, such as a microcontroller or microprocessor, may be provided to manage the electronic memory as well as the interaction between the FPGA or CPLD and the electronic memory.

Alternatively, the computer processor may execute a computer program including a set of computer-readable instructions that perform the functions described herein, the program being stored in any of the above-described non-transitory electronic memories and/or a hard disk drive, CD, DVD, FLASH drive or any other known storage media. Further, the computer-readable instructions may be provided as a utility application, background daemon, or component of an operating system, or combination thereof, executing in conjunction with a processor, such as a Xenon processor from Intel of America or an Opteron processor from AMD of America and an operating system, such as Microsoft VISTA, UNIX, Solaris, LINUX, Apple, MAC-OSX and other operating systems known to those skilled in the art.

In addition, the invention can be implemented using a computer based system 1701. Each of the functions of the above described embodiments may be implemented by one or more processing circuits. A processing circuit includes a programmed processor (for example, processor 1703 in FIG. 17), as a processor includes circuitry. A processing circuit also includes devices such as an application-specific integrated circuit (ASIC) and conventional circuit components arranged to perform the recited functions.

Figure 17:
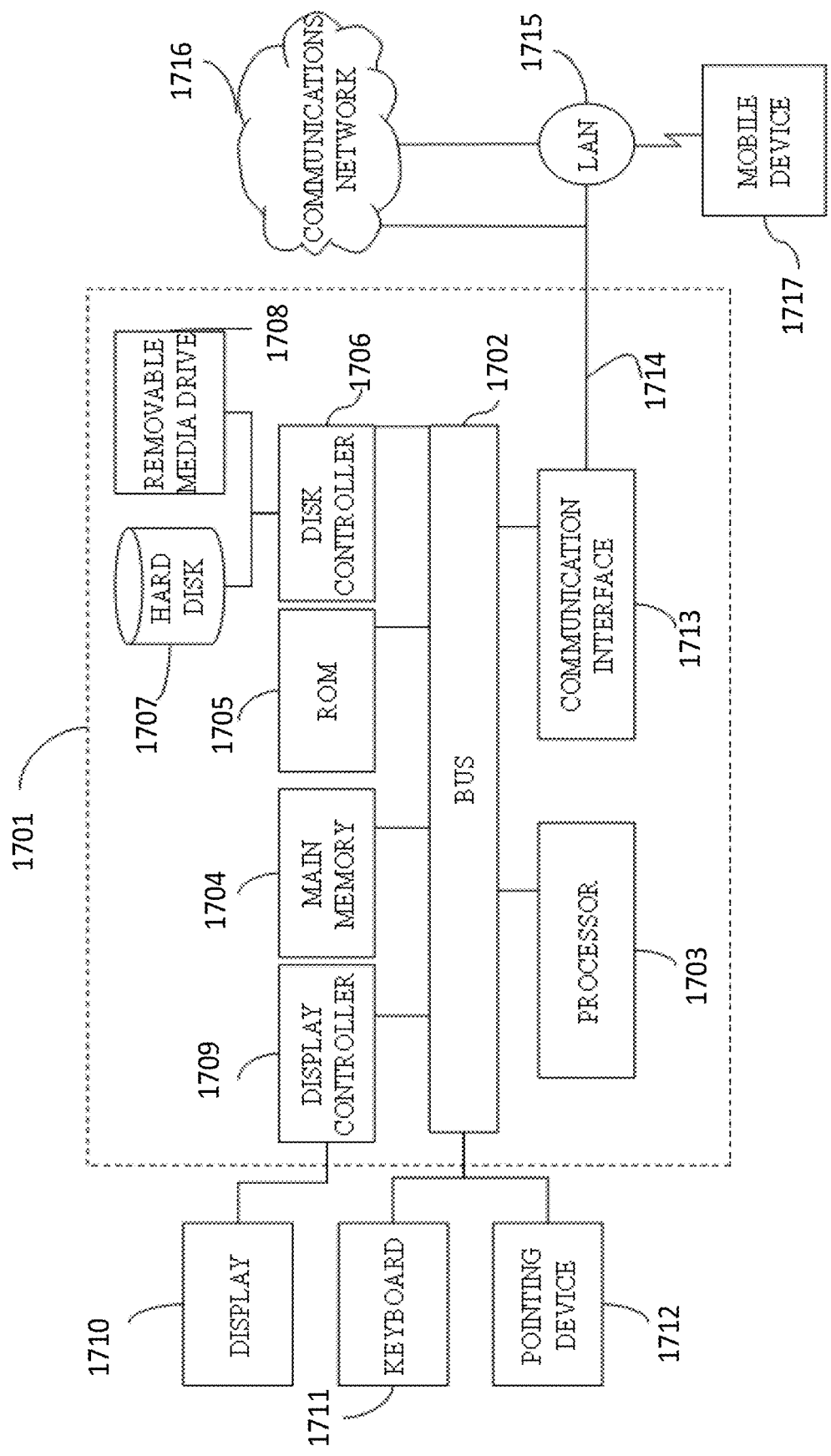
FIG. 17 shows a block diagram of a computing device, according to one implementation.

The various features discussed above may be implemented by a computing device such as a computer system (or programmable logic). FIG. 17 illustrates such a computer system 1701. The computer system 1701 of FIG. 17 may be a particular, special-purpose machine. In one embodiment, the computer system 1701 is a particular, special-purpose machine when the processor 1703 is programmed to compute vector contractions.

The computer system 1701 includes a disk controller 1706 coupled to the bus 1702 to control one or more storage devices for storing information and instructions, such as a magnetic hard disk 1707, and a removable media drive 1708 (e.g., floppy disk drive, read-only compact disc drive, read/write compact disc drive, compact disc jukebox, tape drive, and removable magneto-optical drive). The storage devices may be added to the computer system 801 using an appropriate device interface (e.g., small computer system interface (SCSI), integrated device electronics (IDE), enhanced-IDE (E-IDE), direct memory access (DMA), or ultra-DMA).

The computer system 1701 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer system 1701 may also include a display controller 1709 coupled to the bus 1702 to control a display 1710, for displaying information to a computer user. The computer system includes input devices, such as a keyboard 1711 and a pointing device 1712, for interacting with a computer user and providing information to the processor 1703. The pointing device 1712, for example, may be a mouse, a trackball, a finger for a touch screen sensor, or a pointing stick for communicating direction information and command selections to the processor 1703 and for controlling cursor movement on the display 1710.

The processor 1703 executes one or more sequences of one or more instructions contained in a memory, such as the main memory 1704. Such instructions may be read into the main memory 1704 from another computer readable medium, such as a hard disk 1707 or a removable media drive 1708. One or more processors in a multi-processing arrangement may also be employed to execute the sequences of instructions contained in main memory 1704. In alternative embodiments, hard-wired circuitry may be used in place of or in combination with software instructions. Thus, embodiments are not limited to any specific combination of hardware circuitry and software.

As stated above, the computer system 1701 includes at least one computer readable medium or memory for holding instructions programmed according to any of the teachings of the present disclosure and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes.

Stored on any one or on a combination of computer readable media, the present disclosure includes software for controlling the computer system 1701, for driving a device or devices for implementing the invention, and for enabling the computer system 1701 to interact with a human user. Such software may include, but is not limited to, device drivers, operating systems, and applications software. Such computer readable media further includes the computer program product of the present disclosure for performing all or a portion (if processing is distributed) of the processing performed in implementing any portion of the invention.

The computer code devices of the present embodiments may be any interpretable or executable code mechanism, including but not limited to scripts, interpretable programs, dynamic link libraries (DLLs), Java classes, and complete executable programs. Moreover, parts of the processing of the present embodiments may be distributed for better performance, reliability, and/or cost.

The term "computer readable medium" as used herein refers to any non-transitory medium that participates in providing instructions to the processor 1703 for execution. A computer readable medium may take many forms, including but not limited to, non-volatile media or volatile media. Non-volatile media includes, for example, optical, magnetic disks, and magneto-optical disks, such as the hard disk 1707 or the removable media drive 1708. Volatile media includes dynamic memory, such as the main memory 1704. Transmission media, on the contrary, includes coaxial cables, copper wire and fiber optics, including the wires that make up the bus 1702. Transmission media also may also take the form of acoustic or light waves, such as those generated during radio wave and infrared data communications.

Various forms of computer readable media may be involved in carrying out one or more sequences of one or more instructions to processor 1703 for execution. For example, the instructions may initially be carried on a magnetic disk of a remote computer. The remote computer can load the instructions for implementing all or a portion of the present disclosure remotely into a dynamic memory and send the instructions over a telephone line using a modem. A modem local to the computer system 1701 may receive the data on the telephone line and place the data on the bus 1702. The bus 1702 carries the data to the main memory 1704, from which the processor 1703 retrieves and executes the instructions. The instructions received by the main memory 1704 may optionally be stored on storage device 1707 or 1708 either before or after execution by processor 1703.

The computer system 1701 also includes a communication interface 1713 coupled to the bus 1702. The communication interface 1713 provides a two-way data communication coupling to a network link 1714 that is connected to, for example, a local area network (LAN) 1715, or to another communications network 1716 such as the Internet. For example, the communication interface 1713 may be a network interface card to attach to any packet switched LAN. As another example, the communication interface 1713 may be an integrated services digital network (ISDN) card. Wireless links may also be implemented. In any such implementation, the communication interface 1713 sends and receives electrical, electromagnetic or optical signals that carry digital data streams representing various types of information.

The network link 1714 typically provides data communication through one or more networks to other data devices. For example, the network link 1714 may provide a connection to another computer through a local network 1715 (e.g., a LAN) or through equipment operated by a service provider, which provides communication services through a communications network 1716. The local network 1714 and the communications network 1716 use, for example, electrical, electromagnetic, or optical signals that carry digital data streams, and the associated physical layer (e.g., CAT 5 cable, coaxial cable, optical fiber, etc.). The signals through the various networks and the signals on the network link 1714 and through the communication interface 1713, which carry the digital data to and from the computer system 1701 may be implemented in baseband signals, or carrier wave based signals.

The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1701 can transmit and receive data, including program code, through the network(s) 1715 and 1716, the network link 1714 and the communication interface 1713. Moreover, the network link 1714 may provide a connection through a LAN 1715 to a mobile device 1717 such as a personal digital assistant (PDA) laptop computer, or cellular telephone.

The present embodiments have many applications including but not limited to searching and identifying patterns in data.

While certain implementations have been described, these implementations have been presented by way of example only, and are not intended to limit the teachings of this disclosure. Indeed, the novel methods, apparatuses and systems described herein may be embodied in a variety of other forms; furthermore, various omissions, substitutions and changes in the form of the methods, apparatuses and systems described herein may be made without departing from the spirit of this disclosure.

The invention claimed is:

1. A method of representing and comparing graph data in circuitry, the method comprising:
   receiving input graph data;
   performing a graph structure match search between the input graph data and other graph data in a graph database by:
   representing the input graph data as a generalized combinatorial hypermap;
   bijectively representing a sub-map of the generalized combinatorial hypermap using a plurality of arrays of numbers including an array of fixed point free involutions;
   bijectively mapping the plurality of arrays of numbers to a Gödel number;
   comparing the sub-map of the generalized combinatorial hypermap with another sub-map of the other graph data in the graph database by comparing the Gödel number representing the sub-map to a Gödel number representing the another sub-map, thereby to improve computational efficiency for determining isomorphism between sub-maps in order to efficiently perform composition and unification of the graph data;

compiling a database of compositional patterns to include topologies of sub-maps of the generalized combinatorial hypermap that are determined to be isomorphic with other sub-maps, the sub-map of the generalized combinatorial hypermap being included in the sub-maps of the generalized combinatorial hypermap, and the another sub-map being included in the other sub-maps; and performing unification of respective sub-maps of the generalized combinatorial hypermap when the respective sub-maps of the generalized combinatorial hypermap are determined to be isomorphic with sub-maps of the other graph data in the graph database.

2. The method according to claim 1, wherein the generalized combinatorial hypermap is a generalized combinatorial map.

3. The method according to claim 1, wherein the Gödel number is represented using one of a natural number or a tree-based number.

4. The method according to claim 3, wherein the tree-based number is represented using a self-delimiting three-bit code.

5. The method according to claim 1, wherein the comparing of the sub-map of the generalized combinatorial hypermap to the another sub-map determines whether an isomorphism exists between the generalized combinatorial hypermap and the another sub-map.

6. The method according to claim 5, wherein the determining of whether an isomorphism exists between the generalized combinatorial hypermap and the another sub-map is performed using a Weisfeiler-Lehman test.

7. The method according to claim 1, wherein bijectively mapping of the plurality of arrays of numbers to a Gödel number includes
converting the sub-map of the generalized combinatorial hypermap to a term tree, and
determining the fixed point free involutions using the term tree.

8. The method according to claim 1, wherein the bijectively mapping of the plurality of arrays of numbers to a Gödel number is performed by
performing number composition, using a Cantor pairing function, on an adjacent pair of numbers in the plurality of arrays of numbers by composing the adjacent pair of numbers into a single number to generate the single number that bijectively represents adjacent pair of numbers in the plurality of arrays,
performing number composition, using the Cantor pairing function, on the generated single number and a next number in the plurality of arrays of numbers that is next to the adjacent pair to generate a next single number, and
repeating for each remaining number in the plurality of arrays of numbers a generation of a single number corresponding to a current iteration by using the Cantor pairing function on a generated single number corresponding to an immediately previous iteration and a number of the plurality of arrays of numbers corresponding to a current iteration.

9. The method according to claim 1, wherein the graph data represents one or more of a neural network, a semantic network, a social network, a network of stories, scenarios, traffic paths, a geographic information systems map, and a molecular structure.

10. The method according to claim 1, wherein the generalized combinatorial hypermap includes nodes, darts extending from the respective nodes, edges that include respective pairs of the darts, and edge-adjacent faces that include the respective edges.

11. The method according to claim 1, wherein the generalized combinatorial hypermap includes nodes and respective nodes include corresponding pointers to corresponding data objects.

12. The method according to claim 11, wherein the corresponding data objects include another generalized combinatorial hypermap.

13. The method according to claim 1, further comprising:
decomposing the generalized combinatorial hypermap by cutting edges into darts;
associating respective vertices of the generalized combinatorial hypermap with corresponding edge-agency nodes when the respective vertices are adjacent to respective edges of the generalized combinatorial hypermap;
identifying respective darts to the corresponding edge-agency nodes as being indicators to a subset of sub-maps of the generalized combinatorial hypermap;
associating respective faces of the generalized combinatorial hypermap with corresponding face-agency nodes;
identifying respective darts to the corresponding face-agency nodes as being indicators to another subset of the sub-maps of the generalized combinatorial hypermap; and
iteratively encoding and traversing the sub-maps in a hierarchical manner from higher levels to lower levels to unify isomorphic sub-maps, such that sub-maps that unify structurally are isomorphic up to a level that the sub-maps unify structurally.

14. The method according to claim 1, wherein the performing of the composition and unification of the graph data is performed by
identifying the another sub-map as a model map,
selecting a dart of the sub-map of the generalized combinatorial hypermap to generate Gödel numbers for respective nodes of the sub-map of the generalized combinatorial hypermap using respective pluralities of arrays of numbers that include the fixed point free involutions, wherein each respective plurality of arrays of numbers corresponds to a respective node of the sub-map of the generalized combinatorial hypermap,
obtaining a root of a term-graph of the model map,
comparing respective Gödel numbers of the root and adjacent nodes to the root with the Gödel numbers for respective nodes of the sub-map of the generalized combinatorial hypermap to determine a match, and
signaling that a part of the sub-map of the generalized combinatorial hypermap is isomorphic with a part of the another sub-map when a match is determined.

15. An apparatus to represent and compare graph data, the apparatus comprising:
processing circuitry configured to
receive input graph data,
perform a graph structure match search between the input graph data and other graph data in a graph database by:

represent the input graph data as a generalized combinatorial hypermap,
bijectively represent a sub-map of the generalized combinatorial hypermap using a plurality of arrays of numbers including an array of fixed point free involutions,
bijectively map the plurality of arrays of numbers to a Gödel number,
compare the sub-map of the generalized combinatorial hypermap with another sub-map of the other graph data in the graph database by comparing the Gödel number representing the sub-map to a Gödel number representing the another sub-map, thereby to improve computational efficiency for determining isomorphism between sub-maps in order to efficiently perform composition and unification of the graph data;
compile a database of compositional patterns to include topologies of sub-maps of the generalized combinatorial hypermap that are determined to be isomorphic with other sub-maps, the sub-map of the generalized combinatorial hypermap being included in the sub-maps of the generalized combinatorial hypermap, and the another sub-map being included in the other sub-maps;
perform unification of respective sub-maps of the generalized combinatorial hypermap when the respective sub-maps of the generalized combinatorial hypermap are determined to be isomorphic with sub-maps of the other graph data in the graph database.

16. A non-transitory computer readable storage medium including executable instruction, wherein the instructions, when executed by circuitry, cause the circuitry to perform the method according to claim 1.

17. The apparatus according to claim 15, wherein the generalized combinatorial hypermap is a generalized combinatorial map.

18. The apparatus according to claim 15, wherein the Gödel number is represented using one of a natural number or a tree-based number.

19. The apparatus according to claim 18, wherein the tree-based number is represented using a self-delimiting three-bit code.

20. The apparatus according to claim 15, wherein the comparing of the sub-map of the generalized combinatorial hypermap to the another sub-map determines whether an isomorphism exists between the generalized combinatorial hypermap and the another sub-map.

21. The apparatus according to claim 20, wherein the determining of whether an isomorphism exists between the generalized combinatorial hypermap and the another sub-map is performed using a Weisfeiler-Lehman test.

22. The apparatus according to claim 15, wherein processing circuitry is further configured to perform the bijectively mapping of the plurality of arrays of numbers to a Gödel number by
converting the sub-map of the generalized combinatorial hypermap to a term tree, and
determining the fixed point free involutions using the term tree.

23. The apparatus according to claim 15, wherein the processing circuitry is further configured to perform the bijectively mapping of the plurality of arrays of numbers to a Gödel number by
performing number composition, using a Cantor pairing function, on an adjacent pair of numbers in the plurality of arrays of numbers by composing the adjacent pair of numbers into a single number to generate the single number that bijectively represents adjacent pair of numbers in the plurality of arrays,
performing number composition, using the Cantor pairing function, on the generated single number and a next number in the plurality of arrays of numbers that is next to the adjacent pair to generate a next single number, and
repeating for each remaining number in the plurality of arrays of numbers a generation of a single number corresponding to a current iteration by using the Cantor pairing function on a generated single number corresponding to an immediately previous iteration and a number of the plurality of arrays of numbers corresponding to the current iteration.

24. The apparatus according to claim 15, wherein the graph data represents one or more of a neural network, a semantic network, a social network, a network of stories, scenarios, traffic paths, a geographic information systems map, and a molecular structure.

25. The apparatus according to claim 15, wherein the generalized combinatorial hypermap includes nodes, darts extending from the respective nodes, edges that include respective pairs of the darts, and edge-adjacent faces that include the respective edges.

26. The apparatus according to claim 15, wherein the generalized combinatorial hypermap includes nodes, and respective nodes include corresponding pointers to corresponding data objects.

27. The apparatus according to claim 26, wherein the corresponding data objects include another generalized combinatorial hypermaps.

28. The apparatus according to claim 15, wherein the processing circuitry is further configured to
decompose the generalized combinatorial hypermap by cutting edges into darts;
associate respective vertices of the generalized combinatorial hypermap with corresponding edge-agency nodes when the respective vertices are adjacent to respective edges of the generalized combinatorial hypermap;
identify respective darts to the corresponding edge-agency nodes as being indicators to a subset of sub-map of the generalized combinatorial hypermap;
associate respective faces of the generalized combinatorial hypermap with corresponding face-agency nodes;
identify respective darts to the corresponding face-agency nodes as being indicators to another subset of the sub-map of the generalized combinatorial hypermap; and
iteratively encode and traverse the sub-map in a hierarchical manner from higher levels to lower levels to unify isomorphic sub-map, such that sub-map that unify structurally are isomorphic up to a level that the sub-map unify structurally.

29. The apparatus according to claim 15, wherein the processing circuitry is further configured to perform of the composition and unification of the graph data by
identifying the another sub-map as a model map,
selecting a dart of the sub-map of the generalized combinatorial hypermap to generate Gödel numbers for respective nodes of the sub-map of the generalized combinatorial hypermap using respective pluralities of arrays of numbers that include the fixed point free involutions, wherein each respective plurality of arrays of numbers corresponds to a respective node of the sub-map of the generalized combinatorial hypermap, obtaining a root of a term-graph of the model map,
comparing respective Gödel numbers of the root and adjacent nodes to the root with the Gödel numbers for respective nodes of the sub-map of the generalized combinatorial hypermap to determine a match, and
signaling that a part of the sub-map of the generalized combinatorial hypermap is isomorphic with a part of the another sub-map when a match is determined.

\* \* \* \* \*